(12) United States Patent
Ohtani

(10) Patent No.: US 7,446,340 B2
(45) Date of Patent: Nov. 4, 2008

(54) METHOD OF MANUFACTURING THIN FILM TRANSISTOR

(75) Inventor: Hisashi Ohtani, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 11/890,340

(22) Filed: Aug. 6, 2007

(65) Prior Publication Data

US 2008/0042584 A1   Feb. 21, 2008

Related U.S. Application Data

(63) Continuation of application No. 11/051,005, filed on Feb. 4, 2005, now Pat. No. 7,253,441, which is a continuation of application No. 09/916,913, filed on Jul. 27, 2001, now Pat. No. 6,853,004, which is a continuation of application No. 09/449,140, filed on Nov. 24, 1999, now Pat. No. 6,277,679.

(30) Foreign Application Priority Data

Nov. 25, 1998   (JP) ................................ 10-333853

(51) Int. Cl.
*H01L 29/04* (2006.01)
(52) U.S. Cl. ................................ 257/72; 257/E29.117
(58) Field of Classification Search .................. 257/72, 257/E29.117
See application file for complete search history.

(56) References Cited

U.S. PATENT DOCUMENTS

| | | | |
|---|---|---|---|
| 5,010,027 A | 4/1991 | Possin et al. | |
| 5,439,837 A | 8/1995 | Hata et al. | |
| 5,441,905 A | 8/1995 | Wu | |
| 5,468,987 A | 11/1995 | Yamazaki et al. | |
| 5,576,229 A | 11/1996 | Murata et al. | |
| 5,602,047 A | 2/1997 | Tsai et al. | |
| 5,637,519 A | 6/1997 | Tsai et al. | |
| 5,684,365 A | 11/1997 | Tang et al. | |
| 5,702,960 A | 12/1997 | Moon | |
| 5,719,078 A | 2/1998 | Kim | |
| 5,877,083 A | 3/1999 | Yamazaki | |
| 5,879,969 A | 3/1999 | Yamazaki et al. | |
| 5,917,225 A | 6/1999 | Yamazaki et al. | |
| 5,952,708 A | 9/1999 | Yamazaki | |
| 5,990,542 A | 11/1999 | Yamazaki | |
| 6,063,653 A | 5/2000 | Lin et al. | |
| 6,091,196 A | 7/2000 | Codama | |
| 6,104,461 A | 8/2000 | Zhang et al. | |

(Continued)

*Primary Examiner*—Lex Malsawma
(74) *Attorney, Agent, or Firm*—Cook Alex Ltd.

(57) ABSTRACT

The object of the present invention is to form a low-concentration impurity region with good accuracy in a top gate type TFT. Phosphorus is added to a semiconductor layer by using a pattern made of a conductive film as a mask to form an N-type impurity region in a self-alignment manner. A positive photoresist is applied to a substrate so as to cover the pattern and then is exposed to light applied to the back of the substrate and then is developed, whereby a photoresist 110 is formed. The pattern is etched by using the photoresist pattern as an etching mask to form a gate electrode. A channel forming region, a source region, a drain region, and low-concentration impurity regions, are formed in the semiconductor layer in a self-alignment manner by using the gate electrode as a doping mask.

20 Claims, 16 Drawing Sheets

U.S. PATENT DOCUMENTS

| | | |
|---|---|---|
| 6,114,183 A | 9/2000 | Hamada et al. |
| 6,165,824 A | 12/2000 | Takano et al. |
| 6,169,293 B1 | 1/2001 | Yamazaki |
| 6,218,219 B1 | 4/2001 | Yamazaki et al. |
| 6,229,506 B1 | 5/2001 | Dawson et al. |
| 6,239,470 B1 | 5/2001 | Yamazaki |
| 6,242,758 B1 | 6/2001 | Yamazaki et al. |
| 6,268,695 B1 | 7/2001 | Affinito |
| 6,396,105 B1 | 5/2002 | Yamazaki et al. |

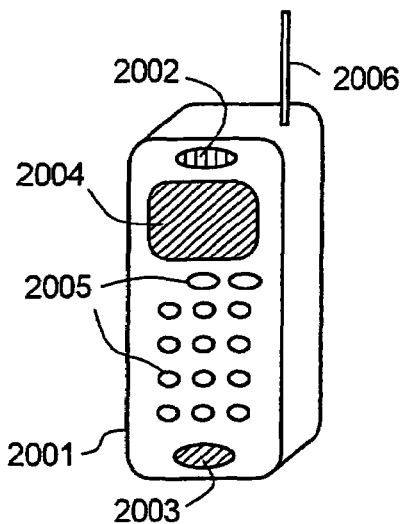
FIG. 8(A)
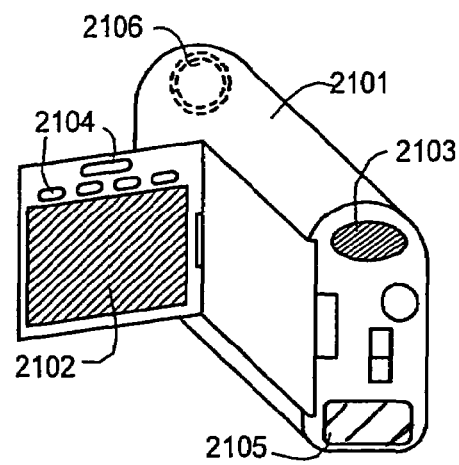
FIG. 8(B)
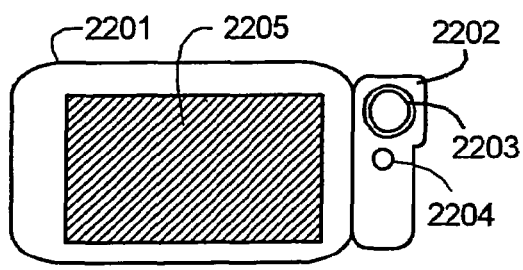
FIG. 8C
FIG. 8(D)
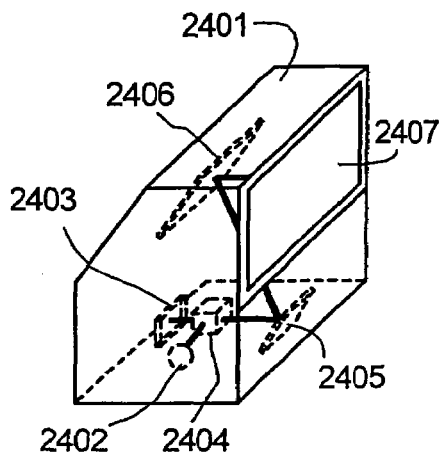
FIG. 8(E)
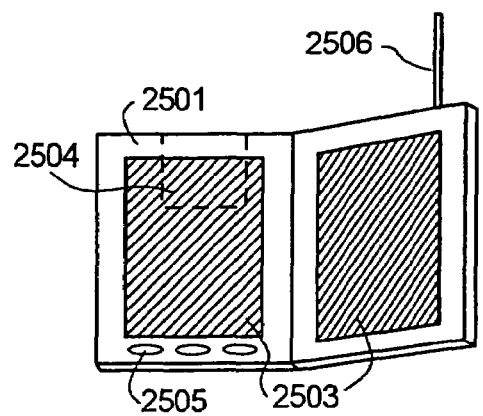
FIG. 8(F)

METHOD OF MANUFACTURING THIN FILM TRANSISTOR

This application is a continuation of U.S. application Ser. No. 11/051,005 filed on Feb. 4, 2005 (now U.S. Pat. No. 7,253,441 issued Aug. 7, 2007) which is a continuation of U.S. application Ser. No. 09/916,913, filed on Jul. 27, 2001 (now U.S. Pat. No. 6,853,004 issued Feb. 8, 2005) which is a continuation of U.S. application Ser. No. 09/449,140, filed on Nov. 24, 1999 (now U.S. Pat. No. 6,277,679 issued Aug. 21, 2001).

BACKGROUND OF THE INVENTION

1. Field of the Invention

The present invention relates to a method of manufacturing a thin film transistor and an active matrix substrate using the thin film transistor as a switching element.

2. Description of the Related Arts

A thin film transistor (hereinafter referred to as a TFT) is utilized for the switching element of a pixel electrode of an active matrix type liquid crystal display device. As the demand for a high-definition liquid crystal display grows, the semiconductor layer of the TFT is required to be formed of polycrystalline silicon instead of amorphous silicon.

If the semiconductor layer of a TFT is formed of polycrystalline silicon, it is possible to manufacture the TFT such that it has high mobility and a large on-current, and hence not only a pixel matrix circuit but also a driver circuit can be integrally formed on the same substrate. However, in the TFT using the polycrystalline silicon, a current leaking from a drain in an off state (that is, off current) is large, and hence, if it is used as the switching element of a matrix circuit, it can not hold the electric potential of the pixel electrode. Therefore, it has been a big problem to reduce the off current of the TFT.

In order to solve this problem, an attempt has been made to relieve voltage concentrated on the drain and to reduce the off current by making a TFT having an offset structure or a light doped drain structure (hereinafter referred to as an LDD structure). A method of manufacturing the TFT having the LDD structure will briefly be described by the use of FIG. 9.

An underlayer film 11 made of a silicon oxide film is formed on a glass substrate 10. An amorphous silicon film is formed on the underlayer film 11 and is polycrystallized by applying an excimer laser thereto. The polycrystallized silicon film is patterned in a shape of island to form a semiconductor layer 12. A gate insulating film 13 made of silicon oxide is formed such that it covers the semiconductor layer 12. A metal film made of aluminum, tantalum, or the like is formed on the gate insulating film 13. A photoresist mask 14 is formed and the metal film is patterned in a predetermined shape by using the photoresist mask 14 to form a gate electrode 15 (see FIG. 9 (A)).

The photoresist mask 14 is removed and then impurities to be donors or acceptors are added to the semiconductor layer 12 by ion doping or by ion implantation by using the gate electrode 15 as a doping mask, whereby impurity regions 16, 17 are formed in the semiconductor layer 12 in a self-alignment manner (see FIG. 9(B)).

A photoresist mask 18 is formed which is wider in the direction of length of channel than the gate electrode 15. The length of a low-concentration impurity region is determined by the shape of the photoresist pattern 18 (see FIG. (C)).

Impurities to be donors or acceptors are added to the semiconductor layer 12 by ion doping or by ion implantation by using the photoresist pattern 18 as a doping mask, whereby a source region 21, a drain region 22, and low-concentration impurity regions 24, 25 are formed in the semiconductor layer 12 (see FIG. 9(D)).

The photoresist pattern 18 is removed and then the impurities added to the semiconductor layer 12 are activated by applying laser light to the substrate or by heating the substrate. An interlayer insulating film 27 comprising silicon oxide film is formed. Contact holes, that lead to the source region 21, the drain region 22, or the terminal part (not shown) of the gate electrode 15, are made in the interlayer insulating film 27. A metal film made of titanium or the like is formed and is patterned to form a source electrode 28, a drain electrode 29 and the lead wiring (not shown) of the gate electrode 15 (see FIG. 9(E)).

In a conventional manufacturing method shown in FIG. 9, the photoresist pattern 18 is used as a doping mask so as to make an LDD structure. Therefore, in order to form the low-concentration impurity region with high accuracy, a photolithography mask is required to be aligned with high accuracy, but there is a problem that as an element becomes finer and a liquid crystal panel becomes larger in area, an alignment accuracy becomes lower.

Therefore, in order to solve the above problem, the present applicant discloses a technology for manufacturing a TFT having an LDD structure in a self-alignment manner in Japanese Patent No. 2759415. In the above Japanese Patent, aluminum is used as a gate electrode material and the LDD structure is formed in a self-alignment manner by using an anodic oxide (alumina) by an oxalic acid and an anodic oxide (alumina) by a tartaric acid as the doping masks.

In the above Japanese Patent, a photoresist is not used as the doping mask and hence the length of the low-concentration impurities region can be controlled with high accuracy, but there is a drawback that the gate electrode material is limited to aluminum. Also, there is another problem that the process temperature is limited to about 400° C. after an aluminum wiring is formed and that aluminum atoms are diffused into a gate insulating film to easily make a short circuit between a gate wiring and a channel, thereby reducing reliability.

Further, in an anodic oxidation process, each gate electrode/wiring makes a short circuit with a voltage supply line, but after an anodic oxidation, it is necessary to etch away the voltage supply and the connection potion of the voltage supply line and the gate wiring and to electrically separate all the gate wirings/electrodes. Therefore, it is necessary to arrange a circuit in consideration of the process margin of etching, which prevents a high-integration design.

SUMMARY OF THE INVENTION

It is an object of the present invention to provide a method of manufacturing a coplanar type (top gate type) TFT having an LOD structure or an offset structure with high accuracy. It is another object of the present invention to provide a method of manufacturing a thin film transistor whose gate wiring (gate electrode) is not limited to aluminum.

In order to achieve the above objects, according to the present invention, a low-concentration impurity region to which donors or acceptors are added is formed in a semiconductor layer in a self-alignment manner by using a gate electrode as a mask. To that end, a conductive film is patterned in two steps to form a gate electrode. In this regard, the gate electrode means a part crossing the semiconductor layer via a gate insulating film in a gate wiring.

First, the conductive film is patterned to form a pattern wider than the length of a channel. Impurities to be donors or acceptors are added to the semiconductor layer by using the pattern made of the conductive film. The pattern made of the conductive film is patterned and made slender in the direction of length of the channel to form the gate electrode.

The patterning mask of this patterning process is formed by exposing a positive photoresist to the light applied to the back of a transparent substrate and by developing it. The pattern made of the conductive film functions as a photolithography mask when the transparent substrate is exposed to the light applied to the back thereof and a photoresist pattern can be formed on the pattern made of the conductive film in a self-alignment manner. The photoresist pattern narrower than the pattern made of the conductive film can be formed with good accuracy by controlling an exposure time and a developing time.

In this connection, in the present specification, the surface of the substrate means a surface on which the semiconductor layer is formed and the back of the substrate means a face opposite thereto.

The low-concentration impurity region is formed in a self-alignment manner by adding impurities by using the gate electrode which is narrower than the pattern made of the conductive film as the mask.

According to the present invention, the length of the low-concentration impurity region is determined by the photoresist pattern like the conventional method, but the photoresist pattern in accordance with the present invention is formed in a self-alignment manner by exposing the substrate to the light applied to the back thereof and the width of the photoresist pattern can be formed with high accuracy by controlling the exposing time and the developing time. Therefore, even if a thin film transistor is made finer and a substrate is increased in area, the length of the low-concentration impurity region can be controlled with high accuracy and with good reproducibility. Further, since the number of photolithography masks can be omitted by one, costs can be reduced and the number of mask alignment processes is reduced and throughput can be expected to improve.

BRIEF DESCRIPTION OF THE DRAWINGS

FIG. 8 is a schematic constitution of an electronic device mounted with a liquid crystal display device in accordance with the present invention. (Example 3)

DESCRIPTION OF THE PREFERRED EMBODIMENTS

Figure 1A:
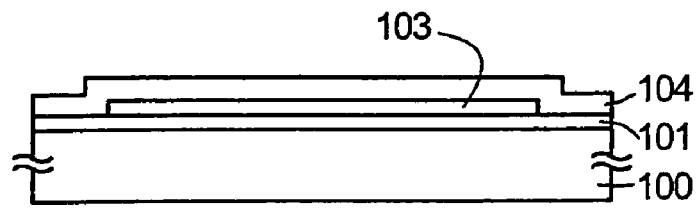
FIG. 1 is a cross-sectional view showing a manufacturing process of a TFT in accordance with the present invention. (Preferred Embodiment 1)
Figure 1B:
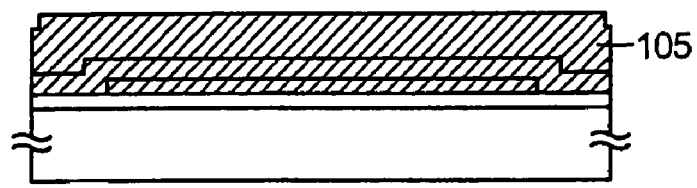
Figure 1C:
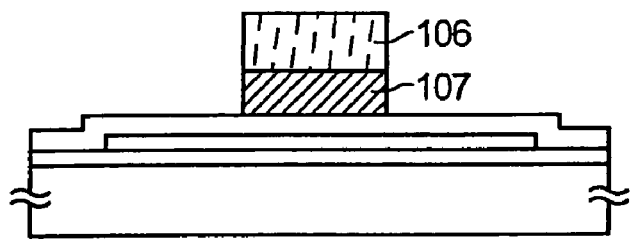

The preferred embodiments in accordance with the present invention will be described by using FIG. 1 and FIG. 2.

Preferred Embodiment 1

The present preferred embodiment relates to a manufacturing method of a TFT having an LDD structure. FIG. 1 and FIG. 2 are cross-sectional views showing a manufacturing process and cross-sectional views in the direction of length of the channel of the TFT.

First, an underlayer film 101 is formed on the whole surface of a substrate 100, and an island-shaped semiconductor layer 103 is formed on the underlayer film 101. An insulating film 104 to be a gate insulating film and covering the semiconductor layer 103 is formed on the whole surface of the substrate 100 (see FIG. 1(A)).

A transparent substrate having a transmissivity of 80% or more, more preferably, of 90% or more, to light applied to the back of the substrate (coherent light having a wavelength 400 nm or less), which is described below, is used as the substrate 100. For example, a glass substrate, a quartz substrate, a crystalline glass substrate, and a resin substrate such as a polyethylene terephthalate (PET) or the like can be used.

The underlayer film 101 is used for preventing impurities such as sodium ions or the like from diffusing from the substrate 100 into the semiconductor layer 103 and for increasing the adhesive performance of a film formed on the substrate 100. A single layer or a multi-layer of an inorganic insulating film such as a silicon oxide film, a silicon nitride film, a silicon oxy-nitride film or the like can be used as the underlayer film 101.

For example, the underlayer film 101 can be formed not only by CVD or by sputtering, but also, in the case of using a heat-resistant substrate such as a quartz substrate, by forming an amorphous silicon film and by thermally oxidizing the amorphous silicon film, to form a silicon oxide film.

It is recommended that the material of the semiconductor layer 103 be selected in accordance with a characteristic required of the TFT, and the following materials can be used as the semiconductor layer 103: amorphous silicon, amorphous silicon germanium, or amorphous germanium, or crystalline silicon, crystalline germanium, or crystalline silicon germanium, each of which is made by crystallizing each of these amorphous semiconductor films by applying a laser to it or by subjecting it to heating treatment. The thickness of the semiconductor layer 103 is made 10 nm to 150 nm.

As the insulating film 104 may be used a single-layer or multi-layer film of an inorganic insulating film comprising silicon oxide, silicon nitride, or silicon oxy-nitride formed by CVD or sputtering. For example, double layered film comprising silicon oxy-nitride film and silicon oxide film, or triple layered film in which silicon nitride film is sandwiched by silicon oxide films.

A conductive film 105 forming a gate electrode /wiring is formed on the insulating film 104. As the conductive film 105, a metal containing Ta, Mo, Ti, Al, and Cu as a major component or an alloy of these metals (for example, a Ta—Mo alloy, a Ta—Al alloy, or a nitride of tantalum or the like), or conductive silicon (Si) containing phosphorus or arsenic or silicide is used.

Next, a photoresist is applied over the conductive film 105 and the surface of the substrate is exposed to light via a photo-lithography mask and is developed to form a photoresist pattern 106. The conductive film 105 is etched by using the photoresist pattern 106 as an etching mask to form a pattern 107 made of the conductive film (see FIG. 1(C)).

After the photoresist pattern 106 is removed, impurities to be donors (to be specific, phosphorus or arsenic) or impurities to be an acceptors (to be specific, boron) are added to the semiconductor layer 103 under conditions of an acceleration voltage of 10 KV to 80 KV, a dose of $1 \times 10^{14}/cm^2$ to $1 \times 10^{17}/cm^2$. Here, phosphorus ions are added by ion doping. The pattern 107 functions as a doping mask and N-type impurity regions 108, 109 are formed in the semiconductor layer 103 in a self-alignment manner. In order to add the impurities, ion implantation, ion diffusion or the like can be used in addition to ion doping (see FIG. 1(D)).

A positive-working photoresist is applied to the whole surface of the substrate such that it covers the pattern 107 made of the conductive film. In this state, the photoresist is exposed to light applied to the back of the substrate, and then is developed to form a photoresist pattern 110 (see FIG. 2(A)).

When the photoresist is exposed to the light applied from the back of the substrate, the pattern 107 made of the conductive film functions as a mask obstructing the light applied to the back of the substrate and hence a pattern 110 is formed on the pattern 107 which is not exposed to the light. In the present invention, by elongating an exposing time (by over-exposing), a photoresist pattern 110 narrower than the pattern 107 can be formed. Here, lengths $\Delta L1$, $\Delta L2$ by which the photoresist pattern 110 is narrowed in the direction of length of a channel, compared with the pattern 107, are controlled by an exposing time and a developing time. Also, the lengths of the low-concentration impurity regions are determined by the lengths $\Delta L1$, $\Delta L2$.

Figure 2A:
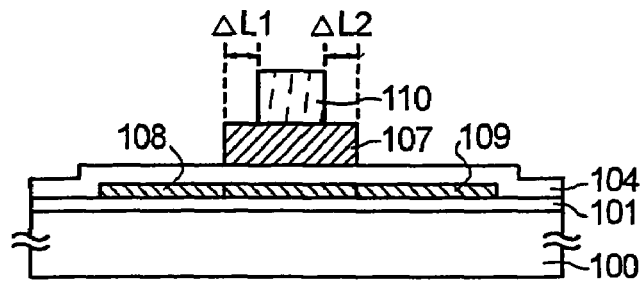
FIG. 2 is a cross-sectional view showing a manufacturing process of a TFT in accordance with the present invention. (Preferred Embodiment 1)
Figure 2B:
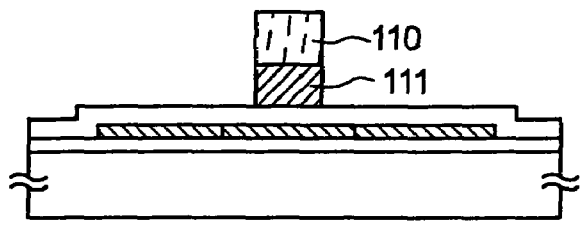
Figure 2C:
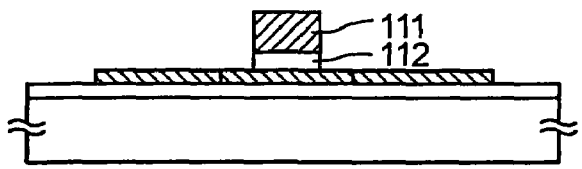

Next, the pattern 107 made of the conductive film is etched by using the photoresist pattern 110 as the etching mask to form a gate electrode 111 narrower in the direction of length of a channel than the pattern 107 (see FIG. 2(B)).

The photoresist pattern 110 is removed and then the insulating film 104 is etched by using gate electrode 111 as the etching mask to form a gate insulating film 112 in a self-alignment manner, whereby the side of the gate insulating film 112 is aligned with the side of the gate electrode 111 to make the same plane. In this connection, in the case where the etching selectivity of the semiconductor layer 103 can not be made large in this etching process, it is preferable to omit the etching process of the insulating film 104.

By using the gate electrode 111 as a doping mask, the same impurities (here, phosphorus) as these added to the impurity regions 108, 109 are added to the semiconductor layer 103 at an acceleration voltage of 10 KV to 80 KV and a dose of $1 \times 10^{12}/cm^2$ to $1 \times 10^{15}/cm^2$, whereby $N^+$-type source region 115 and drain region 116 and $N^-$-type low-concentration impurity regions 117, 118, and a channel forming region 119 are formed in a self-alignment manner. It is recommended that the concentration of phosphorus in the source region 115 and the drain region 116 be $1 \times 10^{19}$ atoms/$cm^3$ to $1 \times 10^{21}$ atoms/$cm^3$ and that the concentration of phosphorus in the low-concentration impurity regions 117, 118 be $1 \times 10^{16}$ atoms/$cm^3$ to $1 \times 10^{19}$ atoms/$cm^3$ (see FIG. 2(D)).

In the present invention, since the light is applied to the back of the substrate so as to form the photoresist pattern 110, the width of the photoresist pattern 110 can be determined by the exposing time and the developing time, and hence the width can be controlled by the exposing time and the developing time with higher accuracy than by alignment. As a result, the length and the position of the low-concentration impurity regions 117, 118 can be controlled with high accuracy. Further, since one photo-lithography mask is not required, cost is reduced and throughput is improved.

The impurities added to the semiconductor layer 103 are activated by subjecting them to heat treatment and/or by exposing them to a laser. Then, they are subjected to heat treatment in a hydrogen atmosphere to terminate the dangling bonds in the semiconductor layer 103 by the hydrogen. After the hydrogenating process is finished, a silicon oxide film or the like is formed as an interlayer insulating film 120. The interlayer insulating film 120 is patterned to make contact holes for the source region 115, the drain region 116, and a gate wiring. A conductive film made of titanium, aluminum, or the like is formed and patterned to form a source electrode 121, a drain electrode 122, and a lead electrode (not shown) of the gate wiring.

Preferred Embodiment 2

In the preferred embodiment 1, a method of manufacturing a TFT having an LDD structure has been described, and in this preferred embodiment, a method of manufacturing a TFT having an offset structure will be described. The present preferred embodiment will be described by using FIGS. 1 and 2.

Figure 1D:
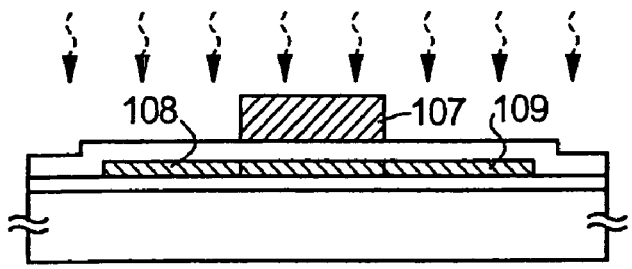
Figure 2D:
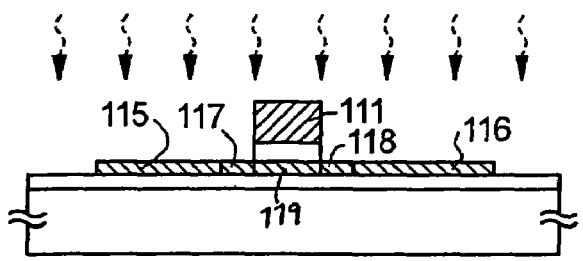
Figure 2E:
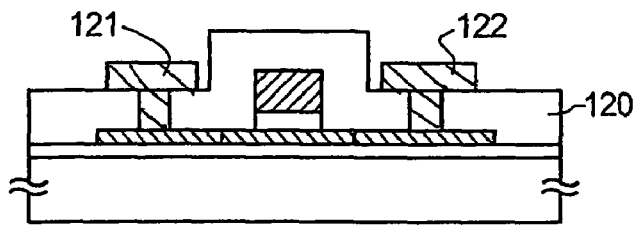
Figure 3A:
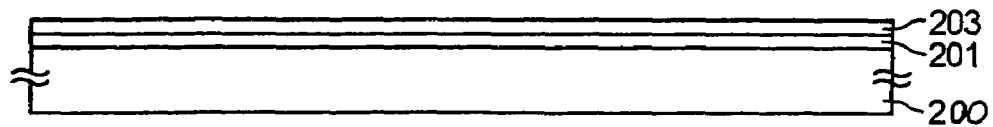
FIG. 3 is a cross-sectional view showing a manufacturing process of a CMOS circuit in accordance with the present invention. (Example 1)
Figure 3B:
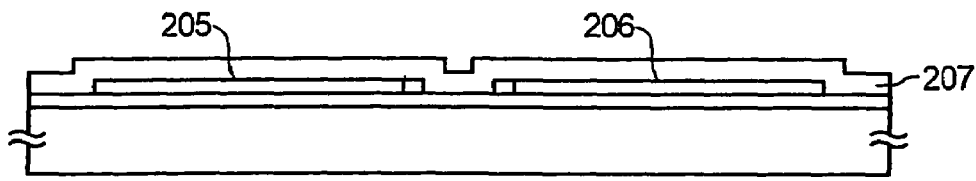
Figure 3C:
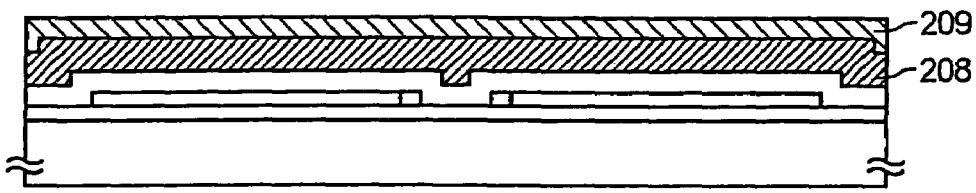
Figure 3D:
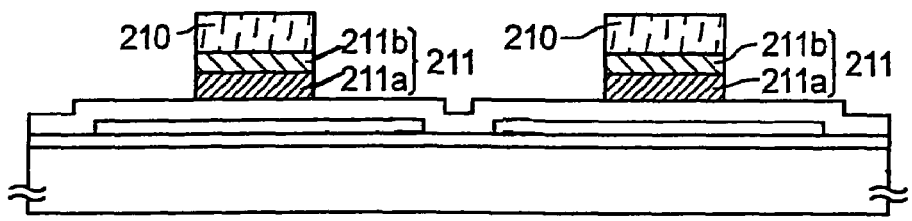
Figure 3E:
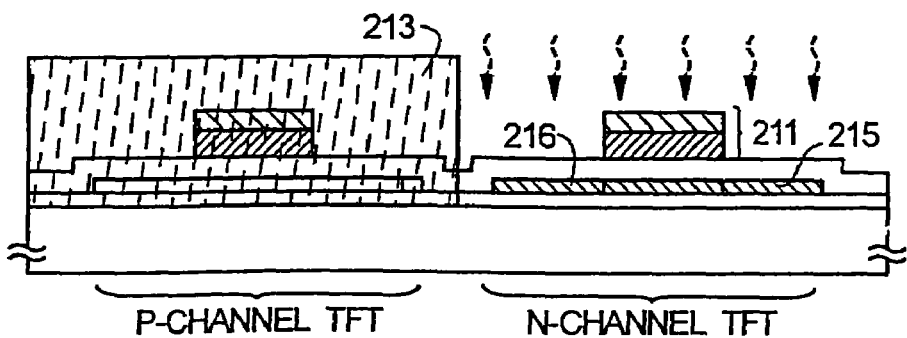

In the case of the present preferred embodiment, the impurity adding process shown in FIG. 2(D) is omitted, and in the impurity adding process shown in FIG. 1(D), a high concentration doping is performed at a dose of $1 \times 10^{15}/cm^2$ to $1 \times 10^{17}/cm^2$ so that the concentration of phosphorus becomes $1 \times 10^{19}$ atoms/$cm^3$ to $1 \times 10^{21}$ atoms/$cm^3$, thereby sufficiently reducing sheet resistance. As a result, a TFT can be manufactured in which the regions 117, 118 become offset regions.

EXAMPLES

The examples in accordance with the present invention will hereinafter be described in detail with reference to FIGS. 3 to 8.

Example 1

The present example is the one applied to a CMOS circuit. The manufacturing process of the CMOS circuit of the present example will be described with reference to FIG. 3 and FIG. 4. FIGS. 3 and 4 are cross-sectional views along the direction of length of the channel of the TFT.

A glass substrate 200 is prepared. In the present example, a 1737 glass substrate made by Corning Glass Corp. is used. An underlayer film 201 is formed on the surface of the glass substrate 200. A silicon oxide film having a thickness of 200 nm is formed by plasma CVD by using TEOS (tetra ethoxy silane) gas as a raw material. The underlayer film 201 is heated at 400° C. for 4 hours.

An amorphous silicon film having a thickness of 500 nm is formed on the underlayer film 201 by plasma enhanced CVD (hereinafter referred to as PECVD) by the use of $SiH_4$ diluted with an $H_2$ gas. A low pressure CVD may be used instead of the PECVD. The a morphous silicon film is heated and dehydrogenated at 450° C. for one hour, whereby the content of hydrogen atom in the amorphous silicon film is made not more than 5%, and more preferably, not more than 1%. The dehydrogenated amorphous silicon is irradiated with excimer laser light to form a crystalline (polycrystalline) silicon film 203.

The conditions of crystallization by a laser are as follows: XeCl excimer laser is used as a laser light source; Laser light is formed by an optical system in linear light; And an overlap ratio is 96% and a laser energy density is 359 mJ/cm$^2$ (see FIG. 3(A)).

In addition to the PECVD, a low pressure CVD or sputtering may be used as a method of forming the amorphous silicon film. Also, in order to crystallize the amorphous silicon film, a laser of a continuous excitation type like an Ar laser may be used other than a laser of an oscillation type like an excimer laser. Further, in order to crystallize the amorphous silicon film, a lamp annealing using a halogen lamp or a mercury lamp, or a heating at a temperature 600° C. or more may be performed instead of applying a laser.

Next, a photoresist pattern (not shown) is formed by a photo-lithography process and then the crystalline silicon film 203 is patterned by the use of the photoresist pattern to form active layers 205, 206. An insulating film 207 to be a gate insulating film is formed such that it covers the active layers 205, 206. Here, a silicon oxy-nitride film having a thickness of 120 nm is formed by PECVD by using $SiH_4$ and $NO_2$ as raw material gases. Then, a conductive laminated film is formed which comprises an N-type silicon film 208 containing phosphorus and a tantalum film 209. Each film is formed by sputtering and the silicon film 208 is 200 nm thick and the tantalum film is 150 thick (see FIG. 3(B)).

The photoresist is exposed to light via a photo-lithography mask and is developed to form a photoresist pattern 210. The tantalum film 209 and the silicon film 208 are patterned by using the photoresist pattern 210 as the etching mask to form a pattern 211 to be a prototype of a gate wiring. These films are etched by a dry etching process using a $O_2$ gas and a $CF_4$ gas. A reference numeral 211$a$ designates an N-type silicon layer and a reference numeral 211$b$ designates a tantalum layer. In the present embodiment, the gate wiring of an N-channel type TFT is integrally formed with the gate wiring of a P-channel type TFT.

The photoresist pattern 210 is removed, and then a photoresist pattern 213 is formed which covers the active layer 205 of the P-channel type TFT. Phosphorus ions are added to the semiconductor layer 206 by ion doping. The ion doping is performed by using phosphine diluted with hydrogen as a doping gas at an acceleration voltage of 80 KV and a dose of $1\times10^{15}$/cm$^2$. The pattern 211 functions as a doping mask to form N-type impurity regions 215, 216 in the semiconductor film 206 in a self-alignment manner.

The photoresist pattern 213 is removed, and then a new photoresist pattern 217 is formed. In this case, a positive photoresist is applied so that it covers the pattern 211 and is exposed to the light applied from the back of the substrate and is developed to form the photoresist pattern 217 on the pattern 211. In the present example, the photoresist pattern 217 is made narrower than the pattern 211 by controlling an exposing time (see FIG. 4(A)).

The pattern 211 is etched by using the photoresist pattern 217 as the etching mask to form a gate wiring 218. In the gate wiring 218, parts crossing the semiconductor layers 205, 206 are gate electrodes. In the gate wiring 218, a reference numeral 218$a$ designates an N-type silicon layer and a reference numeral 218$b$ designates a tantalum layer (see FIG. 4(B)).

The photoresist pattern 217 is removed, and then an insulating film 207 is patterned by using the gate wiring 218 as the etching mask to form a gate insulating film 219. A photoresist pattern 220 is formed which covers the active layer 206 of the N-channel type TFT. The photoresist pattern 220 is formed by applying light to the surface of the substrate via a photo-lithography mask.

Phosphorus ions are added to the semiconductor layer 206 by ion doping. The ion doping is performed by using phosphine diluted with hydrogen as a doping gas at an acceleration voltage of 10 KV and a dose of $3\times10^{13}$/cm$^2$. The gate wiring (gate electrode) 218 functions as a doping mask and N$^+$-type source region 221 and drain region 222, N$^-$-type low-concentration impurity regions 223 and 224, and channel forming region 225 are formed in the semiconductor film 206 in a self-alignment manner.

A photoresist pattern 230 covering the N-channel type TFT is formed. Boron ions are added to the active layer 205 by ion doping. The doping is performed by using diboron diluted with hydrogen as a doping gas at an acceleration voltage of 10 KV and a dose of $2\times10^{15}$/cm$^2$. The gate wiring (gate electrode) 218 functions as a doping mask and P$^+$-type source region 231 and drain region 232 and a channel forming region 233 are formed in a self-alignment manner (see FIG. 4(D)).

In the present example, three photoresist patterns 213, 220, 230 are formed so that phosphorus is not added to the semiconductor layer 206 of the P-channel type TFT, but it is also possible to omit two photoresist patterns 213, 220 which are used for doping the phosphorus, which results in simplifying the manufacturing process and in improving throughput. In this regard, by forming the photoresist patterns 213, 220 like the present example, the sheet resistance of the N-type and P-type impurity regions formed in the semiconductor layer can be controlled with higher accuracy.

Figure 4A:
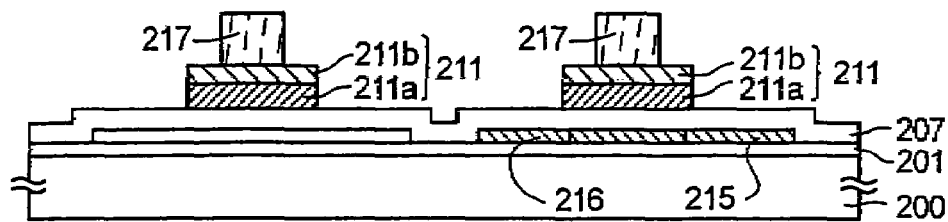
FIG. 4 is a cross-sectional view showing a manufacturing process of a CMOS circuit in accordance with the present invention. (Example 1)
Figure 4B:
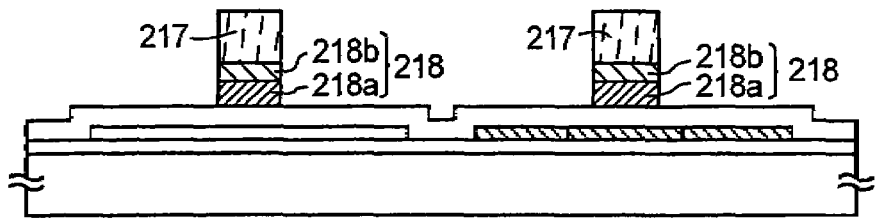
Figure 4C:
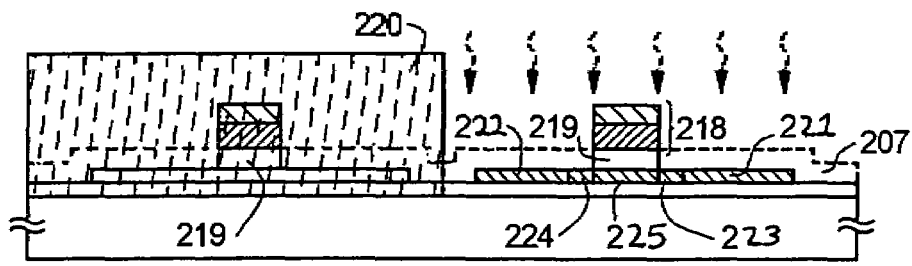
Figure 4D:
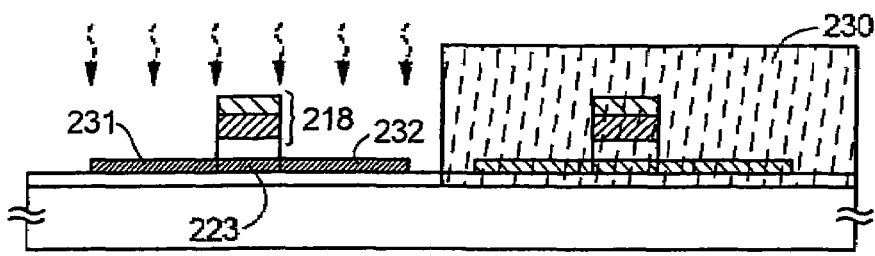
Figure 4E:
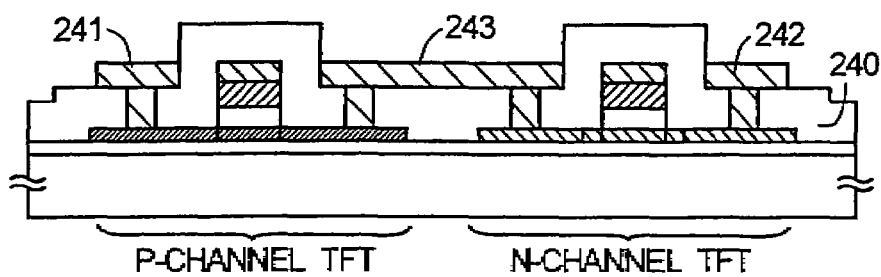

In the case of omitting the photoresist patterns 213, 220, the phosphorus is added to the semiconductor layer 205 of the P-channel type TFT and the N-type impurity region is formed, and hence in the boron adding process shown in FIG. 4(D), it is necessary to determine a dose so that the conductive type of the N-type impurity region is reversed into P-type.

The photoresist pattern 230 is removed, and then the active layers 205, 206 are irradiated with laser light and then are subjected to heat treatment to activate the phosphorus and boron added. The laser light irradiation is performed at a pulse frequency of 50 Hz, a laser energy density of 179 mJ/cm$^2$, and a substrate temperature of 150° C., and the heat treatment is performed in a nitrogen atmosphere at 450° C. for 2 hours. Next, the substrate is heated in a 100% hydrogen atmosphere at 350° C. for 1 hour to terminate dangling bonds of the semiconductor layer by hydrogen.

Next, as the interlayer insulating film 240, a laminated film comprising a silicon nitride having a thickness of 20 nm and a silicon oxide film having a thickness of 900 nm is formed by the PECVD method. Contact holes, that lead to the source regions 221, 231 and the drain regions 222, 232, and a contact hole reaching the terminal part of the gate wiring 218 are formed in the interlayer insulating film 240. A laminated film comprising titanium (150 nm) /aluminum (500 nm)/titanium (100 nm) is formed on the interlayer insulating film 240 by sputtering and is patterned to form source wirings 241, 242, a drain wiring 243, and the lead wiring (not shown)of the gate wiring 218, whereby a CMOS circuit is manufactured on the glass substrate.

In this regard, in the present example, the N-channel type TFT has an LDD structure, but it may easily be manufactured in an offset structure as described.

Example 2

The present preferred example is the one in which the CMOS circuit manufacturing process described in the example 1 is applied to the manufacturing process of the active matrix substrate of the liquid crystal panel.

Figure 5:
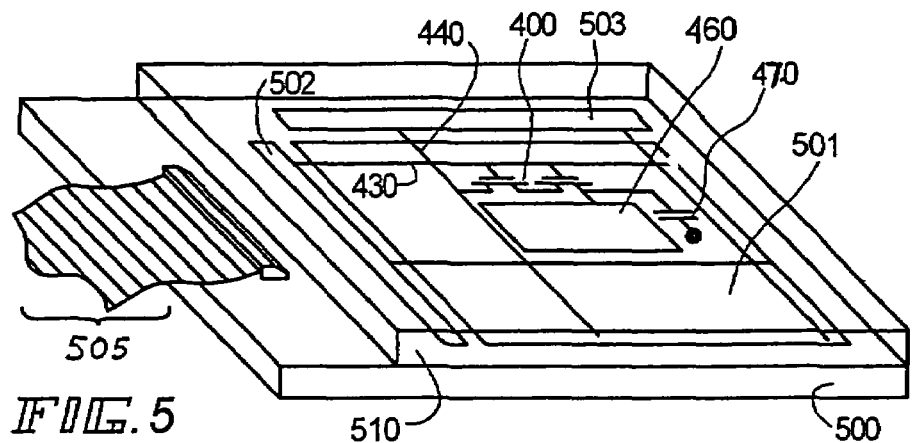
FIG. 5 is a schematic perspective view of an active matrix type liquid crystal panel in accordance with the present invention. (Example 2)

FIG. 5 is a schematic constitution of the active matrix type liquid crystal panel. The liquid crystal panel has a structure in which the liquid crystal is sandwiched by an active matrix substrate and an opposite substrate thereof. The active matrix substrate is the one in which a pixel matrix circuit 501 using a TFT as the switching element of a pixel electrode is formed on the glass substrate 500.

Further, the TFT is manufactured by using the crystalline silicon in the present example, and hence a gate wiring driving circuit 502 and a source wiring driving circuit 503 for driving the pixel matrix circuit 501 are also formed on the glass substrate 500. Still further, external terminals for applying electric power or a control signal to the driving circuits 502, 503 are formed on the glass substrate 500 and a FPC 505 is connected to the external terminals.

The gate wiring driving circuit 502 and the source wiring driving circuit 503 are mainly constituted by CMOS circuits, and are connected to the pixel matrix circuit 501 by gate wirings 430 and source wirings 440.

In the pixel matrix circuit 501, the gate wiring is formed for every column and the source wiring 440 is formed for every row. A pixel TFT 400 is formed near the crossing part of the gate wiring 430 and the source wiring 440. The gate electrode of the pixel TFT 400 is connected to the gate wiring 430 and the source thereof is connected to the source wiring 440. Further, a pixel electrode 460 and a holding capacity 470 is connected to the drain thereof.

A transparent conductive film such as an ITO film or the like is formed on the whole surface of an opposite substrate 510 made of glass. A transparent conductive film is the opposite electrode to the pixel electrode 460 of the pixel matrix circuit 501 and a liquid material is driven by an electric field formed between the pixel electrode and the opposite electrode. Further, if necessary, an alignment film and a color filter are formed on the opposite substrate 510.

Figure 6A:
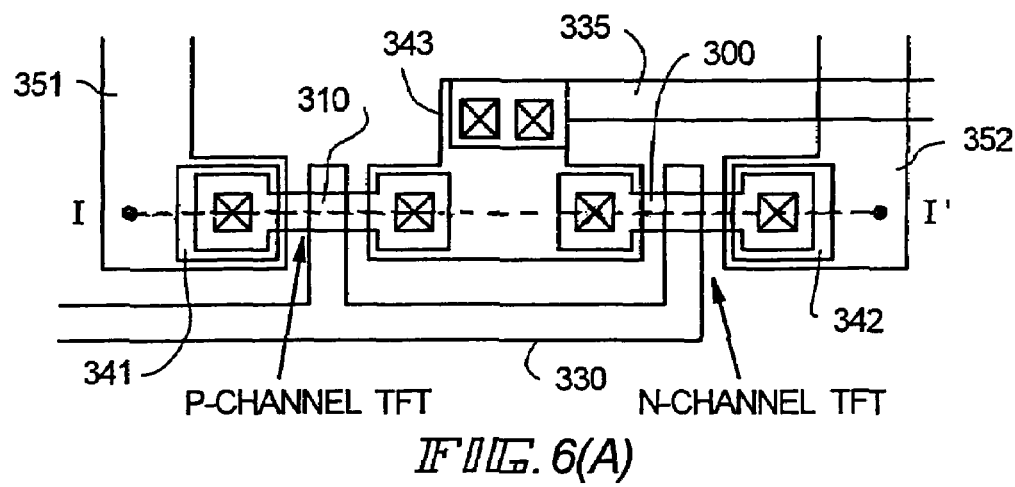
FIG. 6 is a top plan view of a CMOS circuit, a pixel matrix circuit in FIG. 5. (Example 2)
Figure 6B:
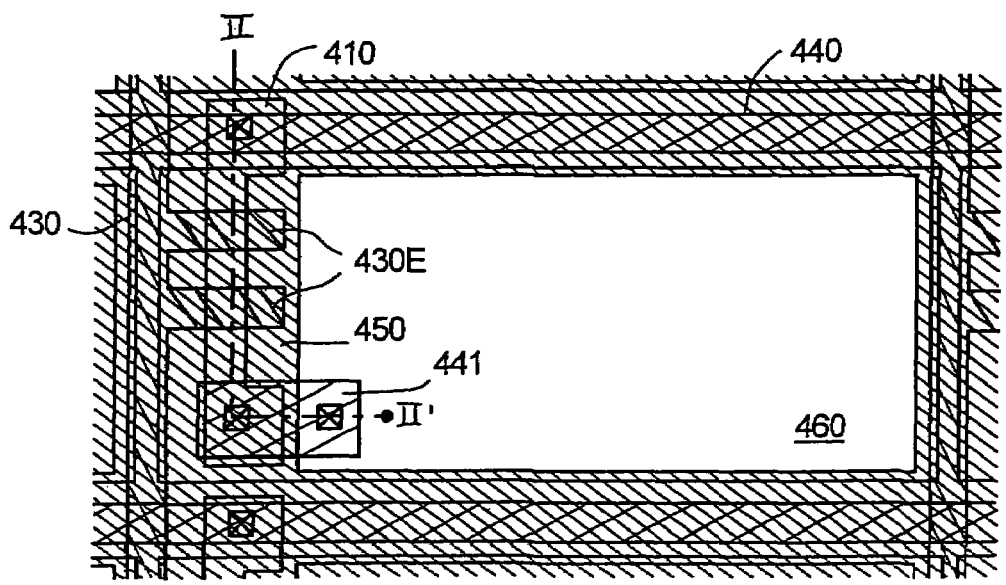
Figure 7:
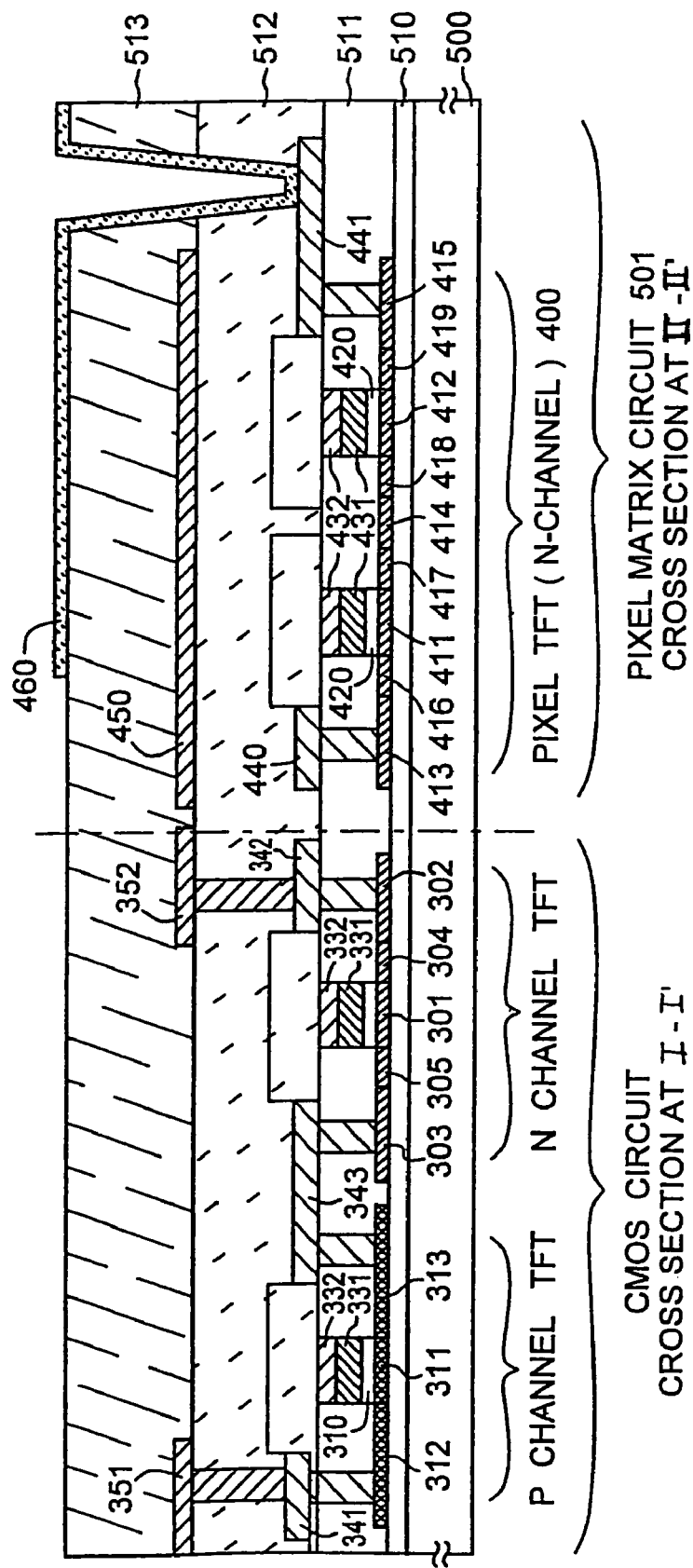
FIG. 7 is a cross-sectional view of an active matrix substrate in FIG. 5. (Example 2)
Figure 9A:
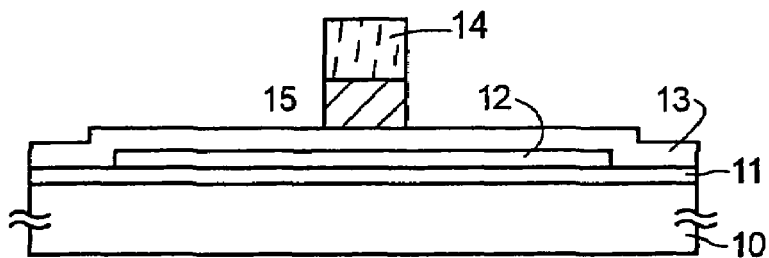
FIG. 9 is a cross-sectional view showing a manufacturing process of a TFT having a conventional LDD structure.
Figure 9B:
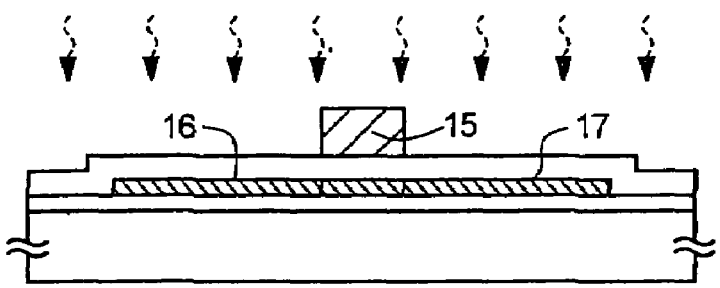
Figure 9C:
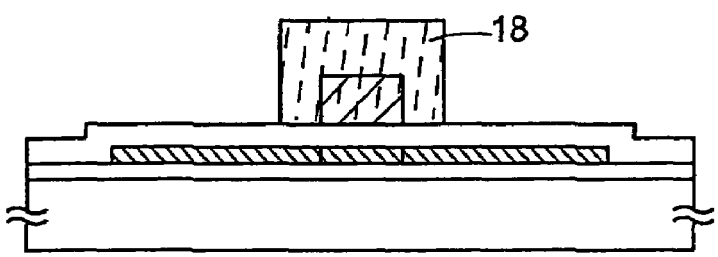
Figure 9D:
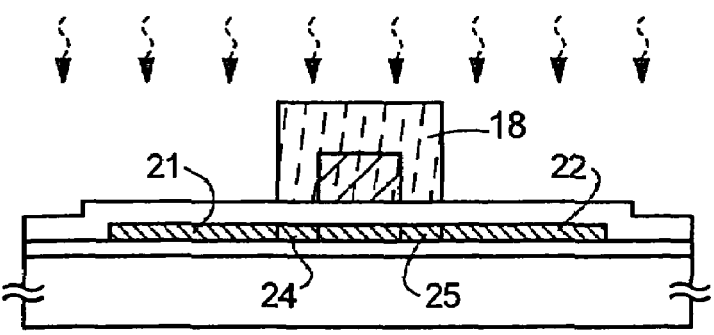
Figure 9E:
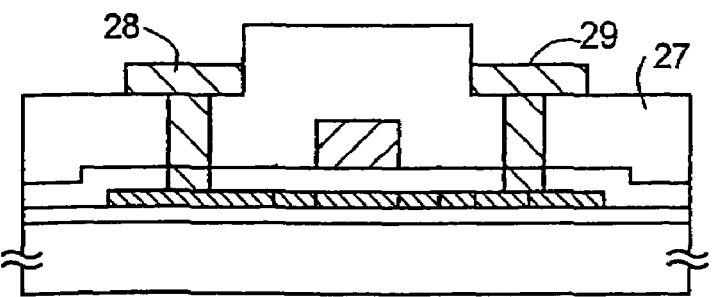

FIG. 6(A) is a top plan view of the pixel matrix circuit 501 and the top plan view of nearly one pixel. FIG. 6(B) is a top plan view of a CMOS circuit constituting the driving circuits 502, 503. FIG. 7 is a cross-sectional view of the active matrix substrate, and a cross-sectional view of the pixel matrix circuit 501 and the CMOS circuit. The cross-sectional view of the CMOS circuit corresponds to a cross-section along a chain line I-I' in FIG. 6(A), and the cross-sectional view of the pixel matrix circuit 501 corresponds to a cross-section along a chain line Y-Y' in FIG. 6 (B).

The CMOS circuit and the pixel TFT of the driving circuit are manufactured on the glass substrate 500 at the same time. In the CMOS circuit, the active layers 300, 310, agate insulating film 320, a gate wiring 330 of the first layer are laminated over an interlayer film 510. The gate wiring 330 is constituted by a laminated film comprising an N-type silicon layer 331 and a tantalum layer 332.

In the active layer of the N-channel type TFT, one channel forming region 301, and a source region 302 and a drain region 300 of the N$^+$-type high concentration impurity region are formed. A pair of N$^-$-type low-concentration impurity regions 304 and 305 are formed, one between the channel forming region 301 and the source region 302 and the other between the channel forming region 301 and the drain region 303, in contact with each region. The concentration of the doner (phosphorus or arsenic) of the N$^-$-type low concentration impurity regions 304, 305 is lower than that of the source region 302 and the drain region 303.

In the active layer of the P-channel type TFT, one channel forming region 311 and P$^+$-type high-concentration impurity regions 312, 313 in contact with the channel forming region 311 are formed. The region 312 is a source region and the region 313 is a drain region.

In the pixel matrix circuit 501, an active layer 410, a gate insulating layer 420, a gate wiring 430 of the first layer wiring are laminated in sequence on the underlayer film 510. The gate wiring 430 is integrally formed with the gate electrode 430E of the pixel TFT 400, and the gate wiring 430 is formed by a laminated film comprising an N-type silicon layer 431 and a tantalum layer 432.

In the active layer 410, two channel forming regions 411, 412 are formed. N$^+$-type high-concentration impurity regions 413, 414 and 415 are formed such that two of them sandwich the channel forming regions 411, or 412. The regions 413, 414 are a source region and a drain region, respectively. Further, in the active layer, a pair of N$^-$-type low-concentration impurity regions 416, 417 are formed sandwiching the channel forming region 411 and a pair of N$^-$-type low-concentration impurity regions 418, 419 are formed sandwiching the channel forming region 412. The concentration of the doner (phosphorus or arsenic) is lower in the low-concentration impurity regions 416, 417, 418, 419 than in the high-concentration impurity regions 413, 414, 415.

An interlayer insulating film 511 covering the active layers 300, 310, 410 is formed on the whole surface of the substrate 500. Source electrodes 341, 342, a drain electrode 343, a source wiring 440, and a drain electrode 441 are formed as the second layer wiring/electrode on the interlayer insulating film 511. As shown in FIG. 6(A), the drain electrode 343 is connected to the gate wiring 335 of the other CMOS circuit.

It is recommended that these CMOS circuit and pixel TFT 400 be manufactured according to the manufacturing process of the example 1. After the TFT is manufactured, as shown in FIG. 7, a first planarizing film 512 is formed on the whole surface of the substrate 500. Here, acrylic is applied by spin coating and then is calcined to form an acrylic film having a thickness of 1 µm.

Contact holes are made in the first planarizing film 512. Then, a titanium film having a thickness of 200 nm is formed by sputtering and then is patterned to form source wirings 351, 352, and a black mask 450.

Next, an acrylic film having a thickness of 0.5 µm is formed as a planarizing film 513 as is the case with the first planarizing film 512. A contact hole to the drain electrode 441 is made in the planarizing film 512, 513. An ITO film is formed by sputtering and then is patterned to form a pixel electrode 460 connected to the drain electrode 441. The planarizing film 513 is made a dielectric body at the portion where the pixel electrode 460 overlaps the black mask 450, whereby a holding capacity 470 having the pixel electrode 460 and the black mask 450 as a pair of electrodes is formed.

In this connection, a reflection type liquid crystal panel can be manufactured by forming the pixel electrode 460 of a material reflecting a visible spectrum such as aluminum, silver, or the like.

Also, although the active matrix substrate is applied to the liquid crystal panel in the present example, it is also possible to apply the active matrix substrate to the other active matrix type display device such as an organic EL or the like. Also, it is easy for a person skilled in this art to manufacture a CMOS-type image sensor by connecting a photoelectric conversion layer having a PIN junction to the pixel TFT.

Example 3

The active matrix type liquid crystal panel shown in the example 2 can be utilized as the display device of various kinds of electronic units. The electronic unit described in the present example is defined as a product mounted with an active matrix type display device.

As such an electronic unit may be mentioned there are, for example, a display device for a computer, a projector, a projection type TV, a head-mounted display, a video camera, a digital still camera, a car navigation system, a notebook-type personal computer, a portable telephone, an electronic notebook, and the like. Examples of these electronic units are shown in FIG. 8.

FIG. 8(A) shows a portable telephone comprising a main body 2001, a voice output part 2002, a voice input part 2003, a display device 2004, an operation switch 2005, and an antenna 2006. The present invention can be applied to the display device 2004 provided with an active matrix substrate.

FIG. 8(B) shows a video camera comprising a main body 2101, a display device 2102, a voice input part 2103, an operation switch 2104, a battery 2105, and an image receiving part 2106. The present invention can be applied to the display device 2102 having the active matrix substrate and the image receiving part 2106.

FIG. 8(C) shows a mobile computer comprising a main body 2201, a camera part 2202, an image receiving part 2203, an operation switch 2204, and a display device 2205. The present invention can be applied to the image receiving part 2203 and the display device 2205.

FIG. 8(D) shows a head mounted display comprising a main body 2301, a display device 2302, and an arm part 2303 for mounting it on the head. The present invention can be applied to the display device 2302. Further, a microphone or an earphone may be mounted on the head-mounted display as a voice input output device.

FIG. 8(E) shows a rear type projector comprising a main body 2401, a light source 2402, a display device 2403, a polarized beam splitter 2404, reflectors 2405, 2406, and a screen 2407. The present invention can be applied to the display device 2403.

FIG. 8(F) shows a portable book comprising a main body 2501, a display devices 2502, 2503, a memory media 2504, and a scanning switch 2505, and for displaying data memorized in a mini-disc (MD) or a DVD or data received by an antenna. The present invention can be applied to the display device 2503.

As described above, the present invention has an extremely wide range of application and can be applied to the whole category of electronic units, and in addition to them, also to an electrically illuminated bulletin board, an advertisement display or the like.

Example 4

Figure 10A:
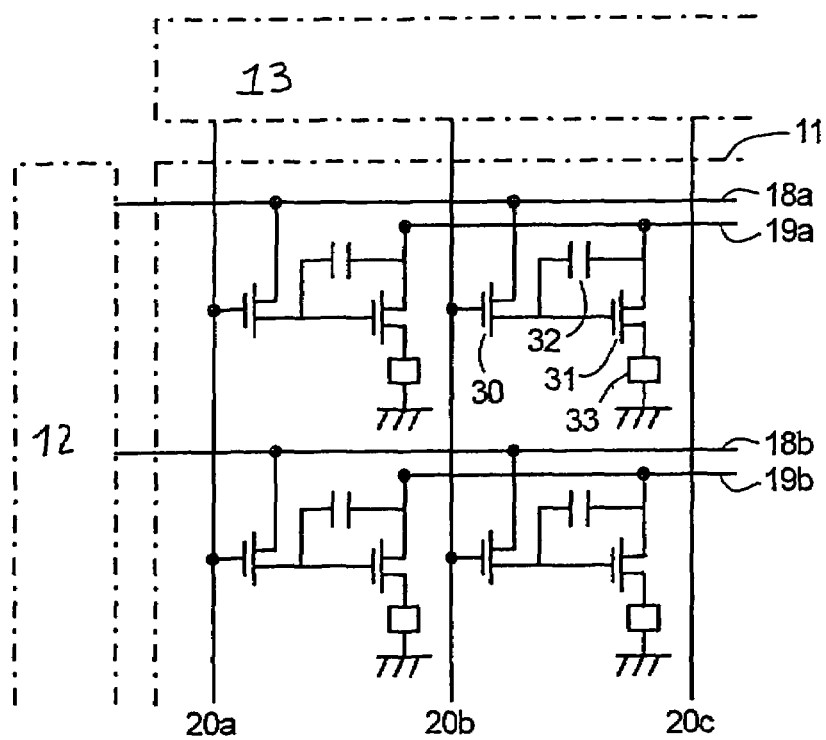
FIG. 10(A) is an EL panel circuit diagram.

This example explains, by referring to FIG. 10, an example case in which this invention is applied to a display (organic EL display) using an active matrix type organic electroluminescence (organic EL) material. FIG. 10(A) shows a circuit diagram of an active matrix type organic EL display having a display area formed on a glass substrate and driving circuits formed along the periphery of the display area. The organic EL display comprises a display area 11 formed on the substrate, an X-direction peripheral driving circuit 12, and a Y-direction peripheral driving circuit 13. The display area 11 comprises a switching TFT 30, a storage capacitance 32, a current control TFT 31, an organic EL element 33, X-direction signal lines 18*a*, 18*b*, power lines 19*a*, 19*b*, and Y-direction signal lines 20*a*, 20*b*, 20*c*.

Figure 10B:
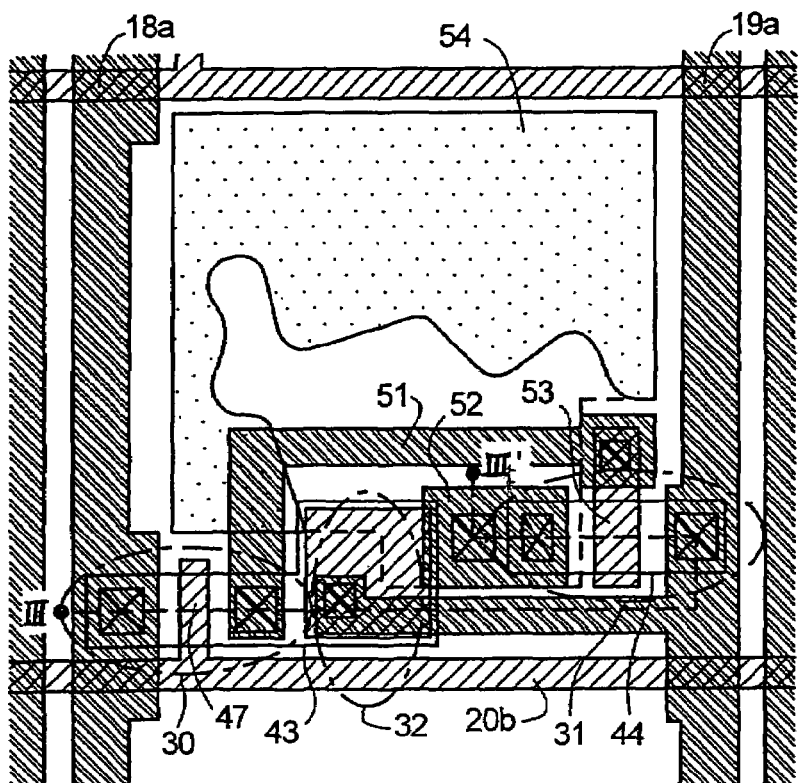
FIG. 10(B) shows a top view of an EL panel pixel.

FIG. 10(B) shows a top view of almost one pixel. The switching TFT 30 and the current control TFT 31 are formed in the same way as in the n-channel TFT shown in FIG. 3(C) of example 1.

Figure 11:
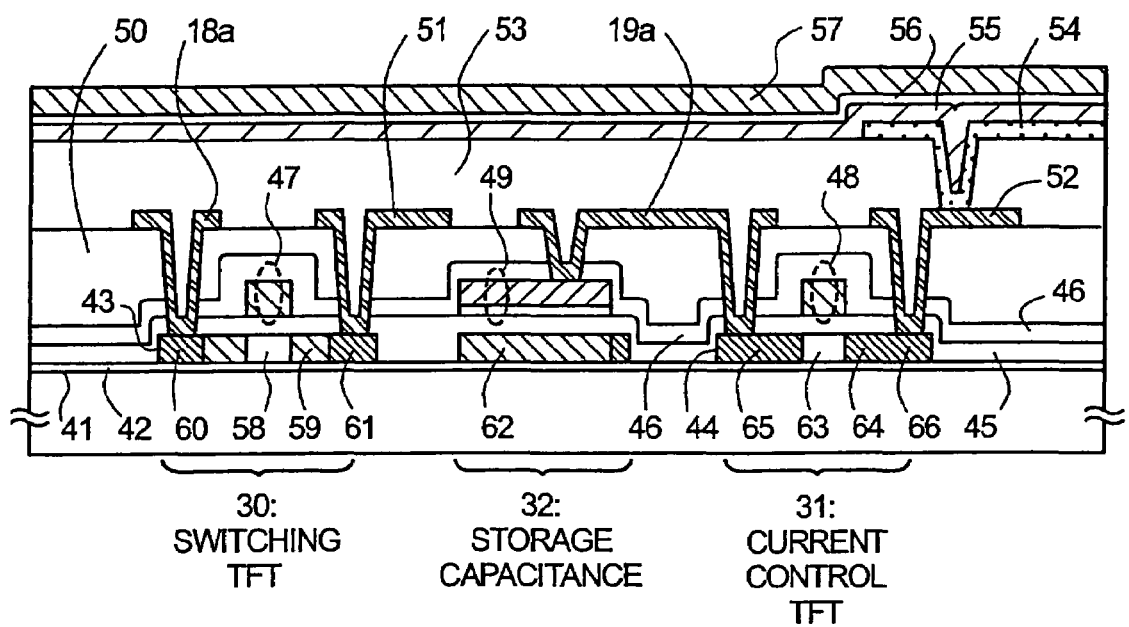
FIG. 11 is a cross sectional view at III-III' of FIG. 10(B) showing a cross section of the switching TFT, storage capacitance, current control TFT and organic EL element portion.

FIG. 11 is a cross section taken along the line III-III' of FIG. 10(B), showing the cross section of the switching TFT 30, storage capacitance 32, current control TFT 31 and organic EL element portion. Over a substrate 40, base films 41, 42, gate insulating film 45, first interlayer insulating film 46, gate electrodes 47, 48, capacitance line 49, source and drain lines 18*a*, 19*a*, 51, 52, and second interlayer insulating film 50 are formed in the same way as in the example 1. Then, over these layers is formed a third interlayer insulating film 53 in a way similar to the second interlayer insulating film 50. A contact hole reaching the drain line 52 is formed, after which a pixel electrode 54 made of a transparent conductive film is formed. The organic EL element portion comprises the pixel electrode 54; an organic EL layer 55 overlying the pixel electrode and the third interlayer insulating film 53; and a first electrode 56 made of Mg—Ag compound and a second electrode 57 made of Al, formed over the organic EL layer 55. If a color filter, though not shown, is used, a color display is possible. By applying the active matrix substrate manufacturing method shown in the examples 1 to 10, the active matrix type organic EL display can be fabricated easily.

TFT of the active matrix type organic EL display shown in this example can be manufactured according to the method of the example 1. The TFT constitution of this example can suitably be applied to an organic EL display described above.

Example 5

This example demonstrates another process for producing an EL (electroluminescence) display device according to the invention of the present application.

Figure 12A:
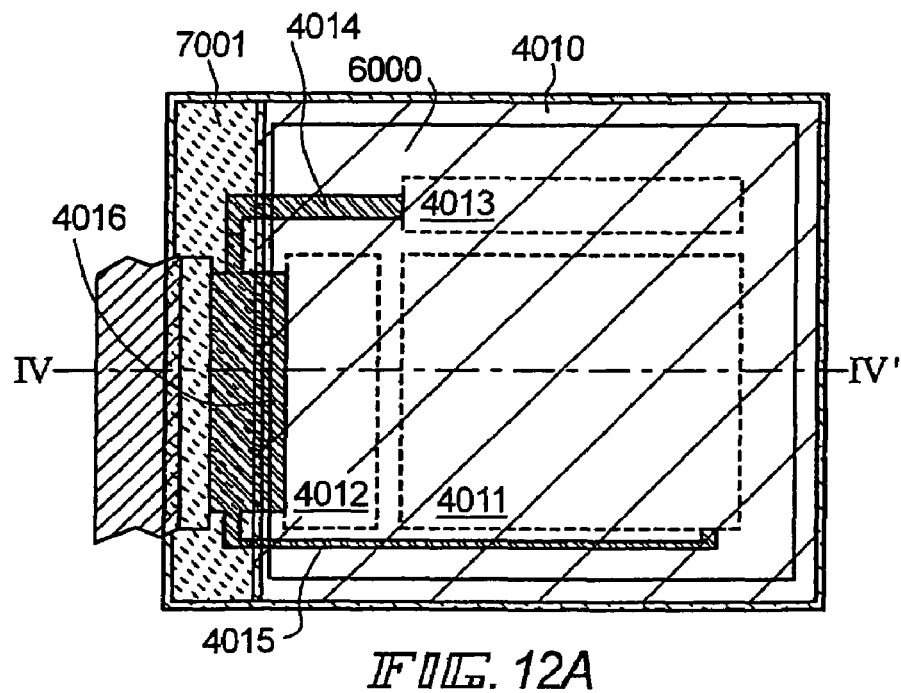
FIG. 12(A) is a top view of an EL panel which shows pixel area, driving area formed on a substrate and FPC which connects the driving area and external equipment.

FIG. 12A is a top view showing an EL display device, which was produced according to the invention of the present application. In FIG. 12A, there are shown a substrate 4010, a pixel part 4011, a driving circuit from the source 4012, and a driving circuit from the gate 4013, each driving circuit connecting to wirings 4014-4016 which reach FPC 4017 leading to external equipment.

The pixel part, preferably together with the driving circuit, is enclosed by a covering material 6000, a sealing material (or housing material) 7000, and an end-sealing material (or second sealing material) 7001.

Figure 12B:
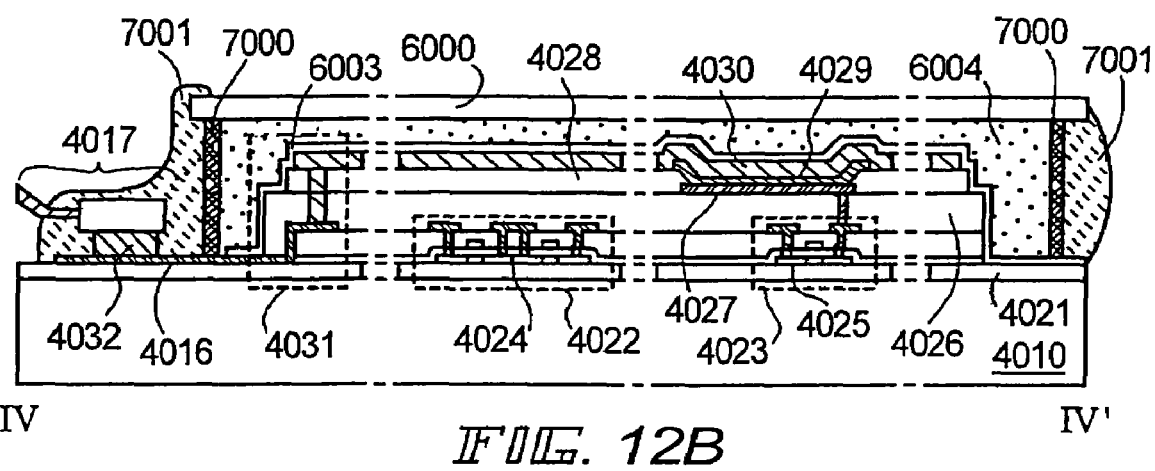
FIG. 12(B) is a cross sectional view at IV-IV' of FIG. 12(A) showing the structure of an EL display device.

FIG. 12B is a sectional view showing the structure of the EL display device in this Example. There is shown a substrate 4010, an underlying coating 4021, a TFT 4022 for the driving circuit, and a TFT 4023 for the pixel unit. (The TFT 4022 shown is a CMOS circuit consisting of an n-channel type TFT and a p-channel type TFT. The TFT 4023 shown is the one, which controls current to the EL element.) These TFTs may be of any known structure (top gate structure or bottom gate structure).

Incidentally, the present invention is used in the TFT 4022 for the driving circuit and the TFT 4023 for the pixel unit.

Upon completion of TFT 4022 (for the driving circuit) and TFT 4023 (for the pixel unit), with their active layer being the semiconductor layer formed according to the invention of the present application, a pixel electrode 4027 is formed on the interlayer insulating film (planarizing film) 4026 made of a resin. This pixel electrode is a transparent conductive film, which is electrically connected to the drain of TFT 4023 for the pixel unit. The transparent conductive film may be formed from a compound (called ITO) of indium oxide and tin oxide or a compound of indium oxide and zinc oxide. On the pixel electrode 4027 is formed an insulating film 4028, in which is formed an opening above the pixel electrode 4027.

Subsequently, the EL layer 4029 is formed. It may be of single-layer structure or multi-layer structure by freely combining known EL materials such as injection layer, hole transport layer, light emitting layer, electron transport layer, and electron injection layer. Any known technology may be available for such structure. The EL material is either a low-molecular material or a high-molecular material (polymer). The former may be applied by vapor deposition, and the latter may be applied by a simple method such as spin coating, printing, or ink-jet method.

In this example, the EL layer is formed by vapor deposition through a shadow mask. The resulting EL layer permits each pixel to emit light differing in wavelength (red, green, and blue). This realizes the color display. Alternative systems available include the combination of color conversion layer (CCM) and color filter and the combination of white light emitting layer and color filter. Needless to say, the EL display device may be monochromatic.

On the EL layer is formed a cathode 4030. Prior to this step, it is desirable to clear moisture and oxygen as much as possible from the interface between the EL layer 4029 and the cathode 4030. This object may be achieved by forming the EL layer 4029 and the cathode 4030 consecutively in a vacuum, or by forming the EL layer 4029 in an inert atmosphere and then forming the cathode 4030 in the same atmosphere without admitting air into it. In this Example, the desired film was formed by using a film-forming apparatus of multi-chamber system (cluster tool system).

The multi-layer structure composed of lithium fluoride film and aluminum film is used in this Example as the cathode 4030. To be concrete, the EL layer 4029 is coated by vapor deposition with a lithium fluoride film (1 nm thick) and an aluminum film (300 nm thick) sequentially. Needless to say, the cathode 4030 may be formed from MgAg electrode which is a known cathode material. Subsequently, the cathode 4030 is connected to a wiring 4016 in the region indicated by 4031. The wiring 4016 to supply a prescribed voltage to the cathode 4030 is connected to the FPC 4017 through an electrically conductive paste material 4032.

The electrical connection between the cathode 4030 and the wiring 4016 in the region 4031 needs contact holes in the interlayer insulating film 4026 and the insulating film 4028. These contact holes maybe formed when the interlayer insulating film 4026 undergoes etching to form the contact hole for the pixel electrode or when the insulating film 4028 undergoes etching to form the opening before the EL layer is formed. When the insulating film 4028 undergoes etching, the interlayer insulating film 4026 may be etched simultaneously. Contact holes of good shape may be formed if the interlayer insulating film 4026 and the insulating film 4028 are made of the same material.

Then, a passivation film 6003, a filling material 6004 and a covering material 6000 are formed so that these layers cover the EL element.

Furthermore, the sealing material 7000 is formed inside of the covering material 6000 and the substrate 4010 such as surrounding the EL element, and the end-sealing material 7001 is formed outside of the sealing material 7000.

The filling material 6004 is formed to cover the EL element and also functions as an adhesive to adhere to the covering material 6000. As the filling material 6004, PVC (polyvinyl chloride), an epoxy resin, a silicon resin, PVB (polyvinyl butyral), or EVA (ethylenvinyl acetate) can be utilized. It is preferable to form a desiccant in the filling material 6004, since a moisture absorption can be maintained.

Also, spacers can be contained in the filling material 6004. It is preferable to use spherical spacers comprising barium oxide to maintain the moisture absorption in the spacers.

In the case of that the spaces are contained in the filling material, the passivasion film 6003 can relieve the pressure of the spacers. Of course, the other film different from the passivation film, such as an organic resin, can be used for relieving the pressure of the spacers.

As the covering material 6000, a glass plate, an aluminum plate, a stainless plate, a FRP (Fiberglass-Reinforced Plastics) plate, a PVF (polyvinyl fluoride) film, a Mylar film, a polyester film or an acryl film can be used. In a case that PVB or EVA is employed as the filling material 6004, it is preferable to use an aluminum foil with a thickness of some tens of μm sandwiched by a PVF film or a Mylar film.

It is noted that the covering material 6000 should have a light transparency with accordance to a light emitting direction (a light radiation direction) from the EL element.

The wiring 4016 is electrically connected to FPC 4017 through the gap between the sealing material 7000 and the end-sealing material 7001, and the substrate 4010. As in the wiring 4016 explained above, other wirings 4014 and 4015 are also electrically connected to FPC 4017 under the sealing material 4018.

Example 6

Figure 13A:
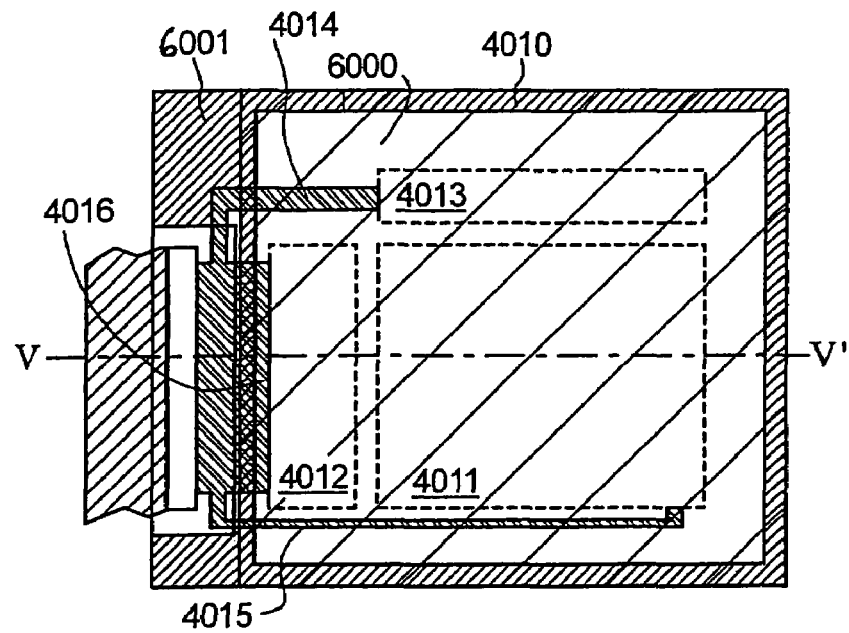
FIG. 13(A) is a top view of an EL panel which shows pixel area, driving area formed on a substrate and FPC which connects the driving area and external equipment.
Figure 13B:
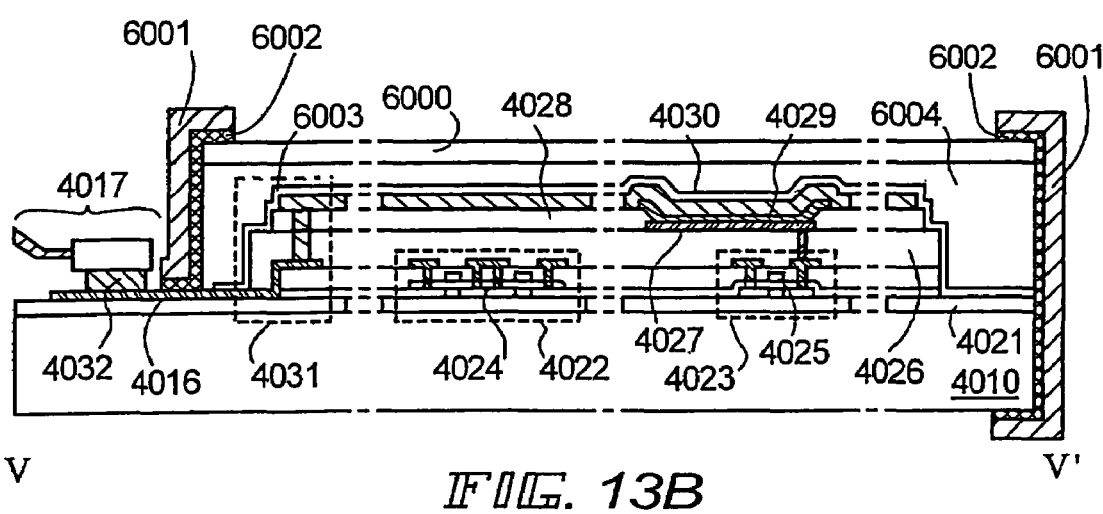
FIG. 13(B) is a cross sectional view at V-V' of FIG. 13(A) showing the structure of an EL display device.

In this example, another EL display device having a different structure from the example 5 is explained, as shown in FIGS. 13A and 13B. The same reference numerals in FIGS. 13A and 13B as in FIGS. 12A and 12B indicate same constitutive elements, so an explanation is omitted.

FIG. 13A shows a top view of the EL module in this example and FIG. 13B shows a sectional view of V-V' of FIG. 13A.

According to Example 5, the passivation film 6003 is formed to cover a surface of the EL element.

The filling material 6004 is formed to cover the EL element and also functions as an adhesive to adhere to the covering material 6000. As the filling material 6004, PVC (polyvinyl chloride), an epoxy resin, a silicon resin, PVB (polyvinyl butyral), or EVA (ethylenvinyl acetate) can be utilized. It is preferable to form a desiccant in the filling material 6004, since a moisture absorption can be maintained.

Also, spacers can be contained in the filling material 6004. It is preferable to use spherical spacers comprising barium oxide to maintain the moisture absorption in the spacers.

In the case of that the spaces are contained in the filling material, the passivasion film 6003 can relieve the pressure of the spacers. Of course, the other film different from the passivation film, such as an organic resin, can be used for relieving the pressure of the spacers.

As the covering material 6000, a glass plate, an aluminum plate, a stainless plate, a FRP (Fiberglass-Reinforced Plastics) plate, a PVF (polyvinyl fluoride) film, a Mylar film, a polyester film or an acryl film can be used. In a case that PVB or EVA is employed as the filling material 6004, it is preferable to use an aluminum foil with a thickness of some tens of μm sandwiched by a PVF film or a Mylar film.

It is noted that the covering material 6000 should have a light transparency with accordance to a light emitting direction (a light radiation direction) from the EL element.

Next, the covering material 6000 is adhered using the filling material 3404. Then, the flame material 6001 is attached to cover side portions (exposed faces) of the filling material 6004. The flame material 6001 is adhered by the sealing material (acts as an adhesive) 6002. As the sealing material 6002, a light curable resin is preferable. Also, a thermal curable resin can be employed if a heat resistance of the EL layer is admitted. It is preferable for the sealing material 6002 not to pass moisture and oxygen. In addition, it is possible to add a desiccant inside the sealing material 6002.

The wiring 4016 is electrically connected to FPC 4017 through the gap between the sealing material 6002 and the substrate 4010. As in the wiring 4016 explained above, other wirings 4014 and 4015 are also electrically connected to FPC 4017 under the sealing material 6002.

Example 7

Figure 14:
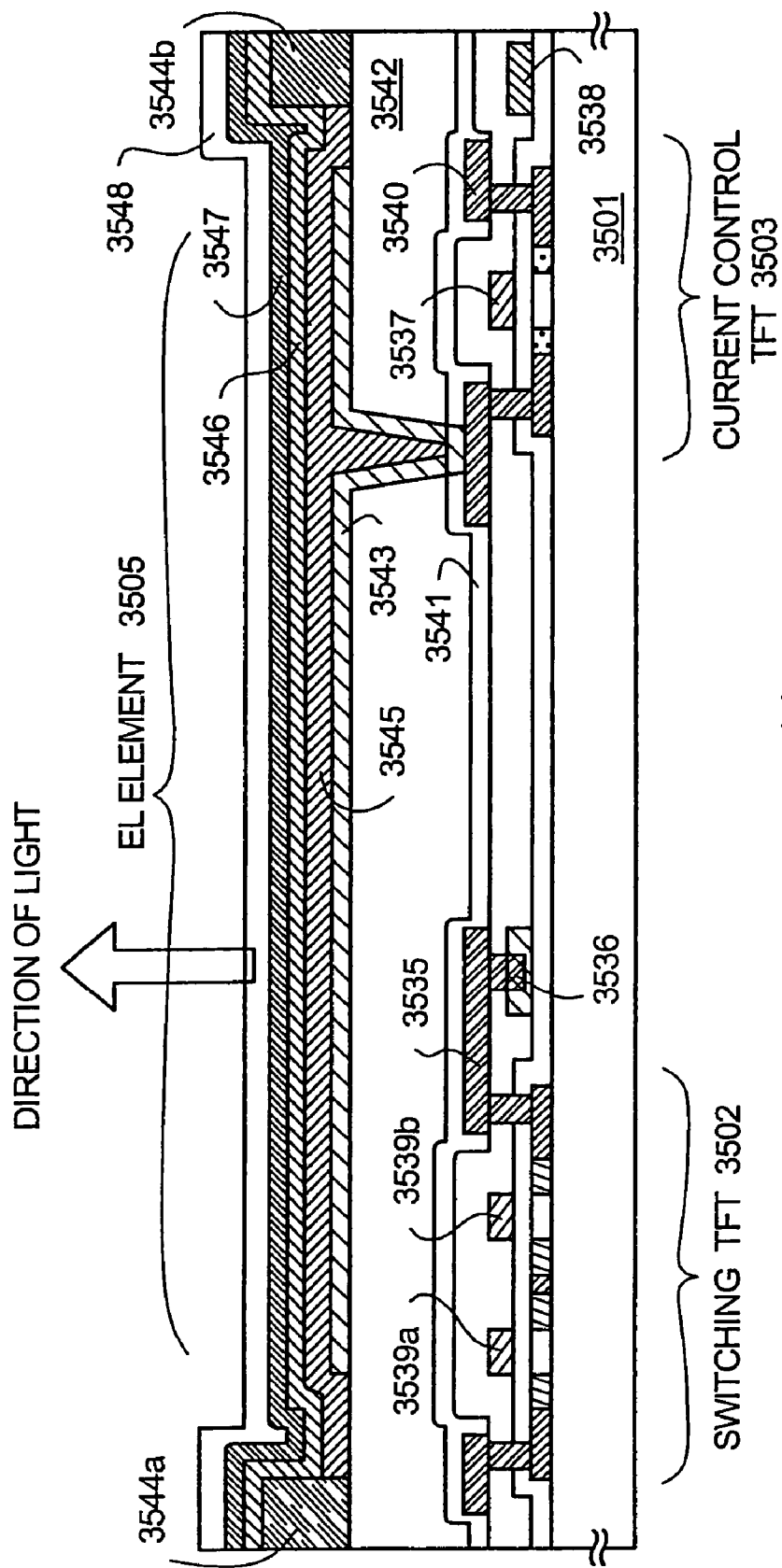
FIG. 14 is a cross sectional view of a pixel area.
Figure 15A:
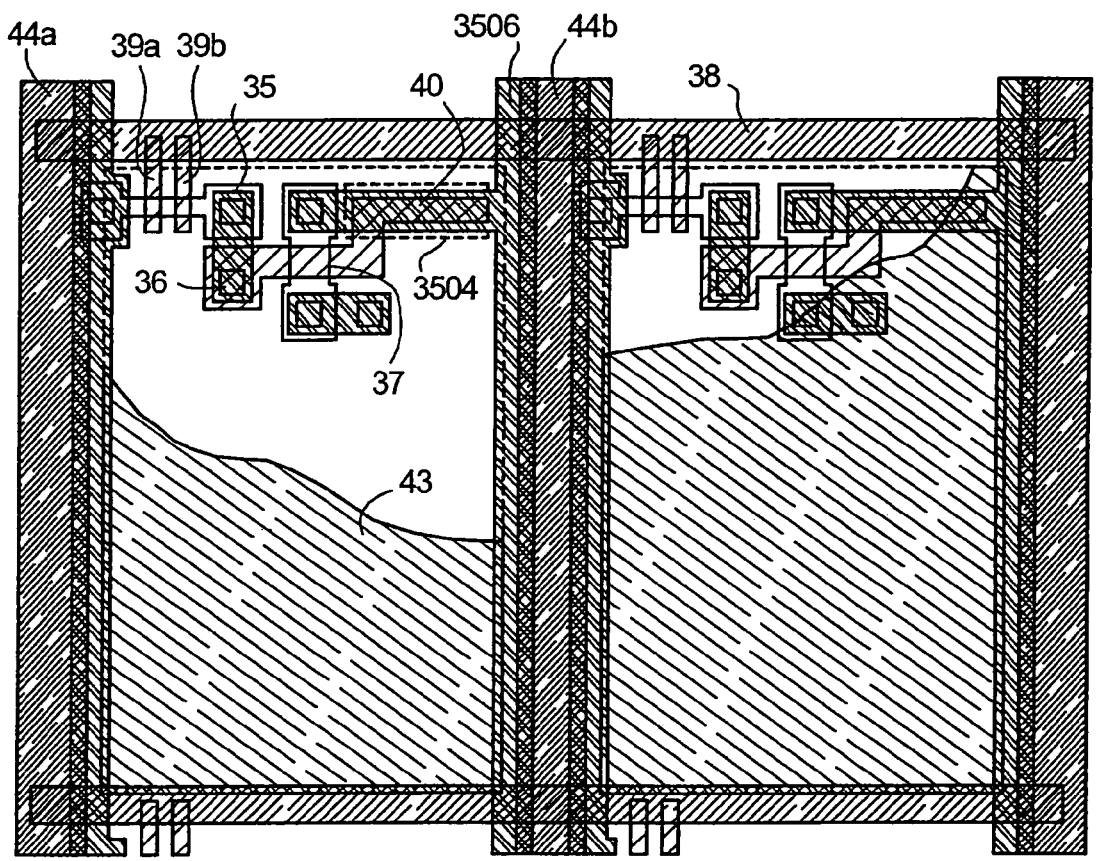
FIG. 15A is a top view of a pixel area.
Figure 15B:
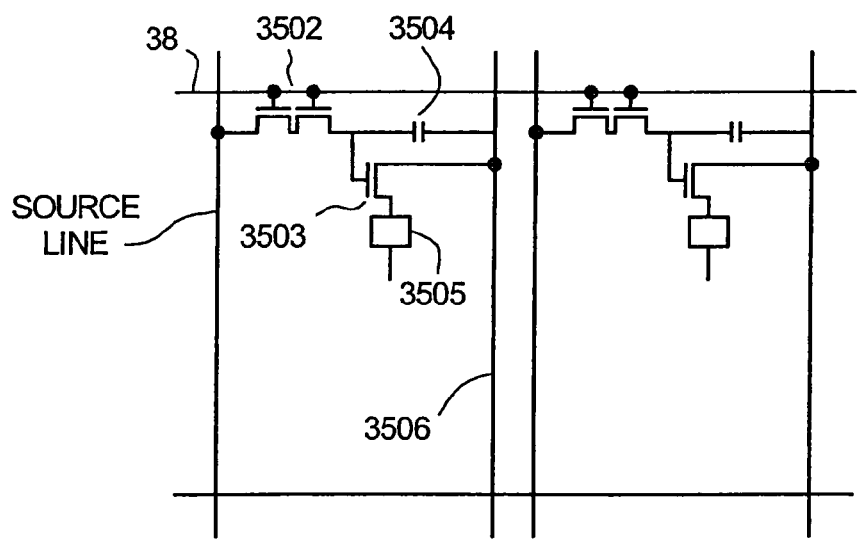
FIG. 15B is an example of a circuit diagram of the pixel area of FIG. 15A.

In this example, the structure of the pixel region in the panel is illustrated in more detail. FIG. 14 shows the cross section of the pixel region; FIG. 15A shows the top view thereof; and FIG. 15B shows the circuit pattern for the pixel region. In FIG. 14, FIG. 15A and FIG. 15B, the same reference numerals are referred to for the same parts, as being common thereto.

In FIG. 14, the switching TFT 3502 formed on the substrate 3501 is NTFT of the invention (cf. Examples 1 to 3). In this Example, it has a double-gate structure, but its structure and fabrication process do not so much differ from the structures and the fabrication processes illustrated hereinabove, and their description is omitted herein. However, the double-gate structure of the switching TFT 3502 has substantially two TFTs as connected in series, and therefore has the advantage of reducing the off-current to pass therethrough. In this Example, the switching TFT 3502 has such a double-gate structure, but is not limitative. It may have a single-gate structure or a triple-gate structure, or even any other multi-gate structure having more than three gates. As the case may be, the switching TFT 3502 may be PTFT of the invention.

The current-control TFT 3503 is NTFT of the invention. The drain wire 3535 in the switching TFT 3502 is electrically connected with the gate electrode 3537 in the current-control TFT, via the wire 3536 therebetween. The wire indicated by 3538 is a gate wire for electrically connecting the gate electrodes 3539a and 3539b in the switching TFT 3502.

It is very important that the current-control TFT 3503 has the structure defined in the invention. The current-control TFT is a unit for controlling the quantity of current that passes through the EL device. Therefore, a large quantity of current passes through it, and the unit, current-control TFT has a high risk of thermal degradation and degradation with hot carriers. To this unit, therefore, the structure of the invention is extremely favorable, in which an LDD region is so constructed that the gate electrode overlaps with the drain area in the current-control TFT, via a gate-insulating film therebetween.

In this Example, the current-control TFT 3503 is illustrated to have a single-gate structure, but it may have a multi-gate structure with plural TFTs connected in series. In addition, plural TFTs may be connected in parallel so that the channel-forming region is substantially divided into plural sections. In the structure of that type, heat radiation can be effected efficiently. The structure is advantageous for protecting the device with it from thermal deterioration.

As in FIG. 15A, the wire to be the gate electrode 3537 in the current-control TFT 3503 overlaps with the drain wire 3540 therein in the region indicated by 3504, via an insulating film therebetween. In this state, the region indicated by 3504 forms a capacitor. The capacitor 3504 functions to retain the voltage applied to the gate in the current-control TFT 3503. The drain wire 3540 is connected with the current supply line (power line) 3501, from which a constant voltage is all the time applied to the drain wire 3540.

On the switching TFT 3502 and the current-control TFT 3503, formed is a first passivation film 3541. On the film 3541, formed is a planarizing film 3542 of an insulating resin. It is extremely important that the difference in level of the layered parts in TFT is removed through planarization with the planarizing film 3542. This is because the EL layer to be formed on the previously formed layers in the later step is extremely thin, and if there exist a difference in level of the previously formed layers, the EL device will be often troubled by light emission failure. Accordingly, it is desirable to previously planarize as much as possible the previously formed layers before the formation of the pixel electrode thereon so that the EL layer could be formed on the planarized surface.

The reference numeral 3543 indicates a pixel electrode (a cathode in the EL device) of an electroconductive film with high reflectivity. The pixel electrode 3543 is electrically connected with the drain in the current-control TFT 3503. It is preferable that the pixel electrode 3543 is of a low-resistance electroconductive film of an aluminium alloy, a copper alloy or a silver alloy, or of a laminate of those films. Needless-to-say, the pixel electrode 3543 may have a laminate structure with any other electroconductive films.

In the recess (this corresponds to the pixel) formed between the banks 3544a and 3544b of an insulating film (preferably of a resin), the light-emitting layer 44 is formed. In the illustrated structure, only one pixel is shown, but plural light-emitting layers could be separately formed in different pixels, corresponding to different colors of R (red), G (green) and B (blue). The organic EL material for the light-emitting layer may be any π-conjugated polymer material. Typical polymer materials usable herein include polyparaphenylenevinylene (PVV) materials, polyvinylcarbazole (PVK) materials, polyfluorene materials, etc.

Various types of PVV-type organic EL materials are known, such as those disclosed in "H. Shenk, H. Becker, O. Gelsen, E. Klunge, W. Kreuder, and H. Spreitzer; Polymers for Light Emitting Diodes, Euro Display Proceedings, 1999, pp. 33-37" and in Japanese Patent Laid-Open No. 92576/1998. Any of such known materials are usable herein.

Concretely, cyanopolyphenylenevinylenes maybe used for red-emitting layers; polyphenylenevinylenes may be for green-emitting layers; and polyphenylenevinylenes or polyalkylphenylenes may be for blue-emitting layers. The thickness of the film for the light-emitting layers may fall between 30 and 150 nm (preferably between 40 and 100 nm).

These compounds mentioned above are referred to merely for examples of organic EL materials employable herein and are not limitative at all. The light-emitting layer maybe combined with a charge transportation layer or a charge injection layer in any desired manner to form the intended EL layer (this is for light emission and for carrier transfer for light emission) Specifically, this Example is to demonstrate the example of using polymer materials to form light-emitting layers, which, however, is not limitative. Apart from this, low-molecular organic EL materials may also be used for light-emitting layers. For charge transportation layers and charge injection layers, further employable are inorganic materials such as silicon carbide, etc. Various organic EL materials and inorganic materials for those layers are known, any of which are usable herein.

In this Example, a hole injection layer 46 of PEDOT (polythiophene) or PAni (polyaniline) is formed on the light-emitting layer 3545 to give a laminate structure for the EL layer. On the hole injection layer 46, formed is an anode 3547 of a transparent electroconductive film. In this Example, the light having been emitted by the light-emitting layer 3545 radiates therefrom in the direction toward the top surface (that is, in the upward direction of TFT). Therefore, in this, the anode must transmit light. For the transparent electroconductive film for the anode, usable are compounds of indium oxide and tin oxide, and compounds of indium oxide and zinc oxide. However, since the anode is formed after the light-emitting layer and the hole injection layer having poor heat resistance have been formed, it is preferable that the transparent electroconductive film for the anode is of a material capable of being formed into a film at as low as possible temperatures.

When the anode 3547 is formed, the EL device 3505 is finished. The EL device 3505 thus fabricated herein indicates a capacitor comprising the pixel electrode (cathode) 3543, the light-emitting layer 3545, the hole injection layer 4 and the anode 3547. As in FIG. 15A, the region of the pixel electrode 43 is nearly the same as the area of the pixel. Therefore, in this, the entire pixel functions as the EL device. Accordingly, the light utility efficiency of the EL device fabricated herein is high, and the device can display bright images.

In this Example, a second passivation film 3548 is formed on the anode 3547. For the second passivation film 3548, preferably used is a silicon nitride film or a silicon oxy nitride film. The object of the film 3548 is to insulate the EL device from the outward environment. The film 48 has the function of preventing the organic EL material from being degraded through oxidation and has the function of preventing it from degassing. With the second passivation film 3548 of that type, the reliability of the EL display device is improved.

As described hereinabove, the EL display panel of the invention fabricated in this Example has a pixel region for the pixel having the constitution as in FIG. 14, and has the switching TFT through which the off-current to pass is very small to a satisfactory degree, and the current-control TFT resistant to hot carrier injection. Accordingly, the EL display panel fabricated herein has high reliability and can display good images.

The constitution of this Example can be combined with any constitution of Examples 1 to 2 in any desired manner. Incorporating the EL display panel of this Example into the electronic appliance of Example 3 as its display part is advantageous.

Example 8

This Example is to demonstrate a modification of the EL display panel of Example 7, in which the EL device 3505 in the pixel region has a reversed structure. For this Example, referred to is FIG. 16. The constitution of the EL display panel of this Example differs from that illustrated in FIG. 15A only in the EL device part and the current-control TFT part. Therefore, the description of the other parts except those different parts is omitted herein.

Figure 16:
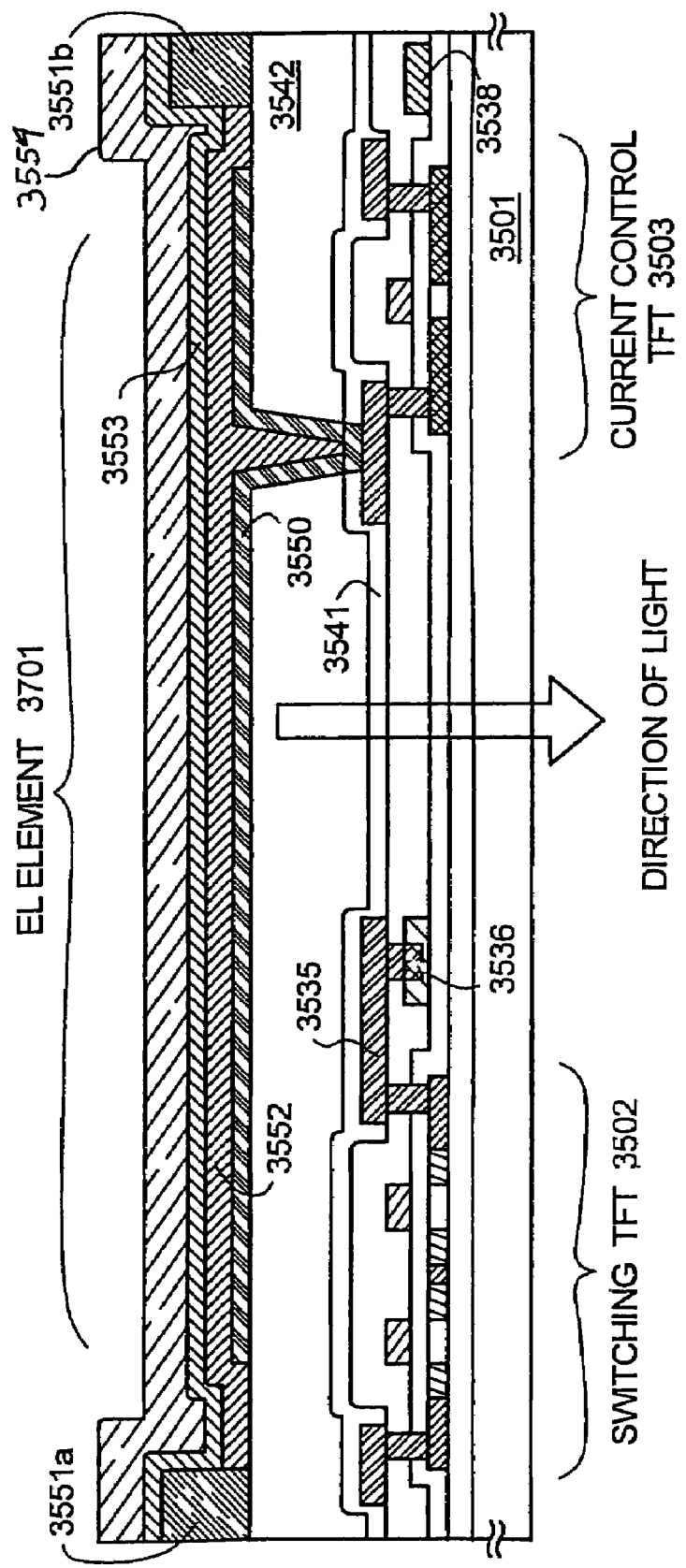
FIG. 16 is a cross sectional view showing the structure of an EL element.

In FIG. 16, the current-control TFT 3701 may be PTFT of the invention. For the process of forming it, referred to is that of Example 1 and 2.

In this Example, the pixel electrode (anode) 3550 is of a transparent electroconductive film. Concretely, used is an electroconductive film of a compound of indium oxide and zinc oxide. Needless-to-say, also usable is an electroconductive film of a compound of indium oxide and tin oxide.

After the banks 51a and 51b of an insulating film have been formed, a light-emitting layer 3552 of polyvinylcarbazole is formed between them in a solution coating method. On the light-emitting layer 3552, formed are an electron injection layer 3553 of acetylaceton a to potassium (hereinafter acacK), and a cathode 3554 of an aluminium alloy. In this case, the cathode 3554 serves also as a passivation film. Thus is fabricated the EL device 3701.

In this Example, the light having been emitted by the light-emitting layer radiates in the direction toward the substrate with TFT formed thereon, as in the direction of the arrow illustrated.

The constitution of this Example can be combined with any constitution of Examples 1 and 2 in any desired manner Incorporating the EL display panel of this Example into the electronic appliance of Example 3 as its display part is advantageous.

Example 9

This Example is to demonstrate modifications of the pixel with the circuit pattern of FIG. 15B. The modifications are as in FIG. 17A to FIG. 17C. In this Example illustrated in those FIG. 17A through FIG. 17C, 3801 indicates the source wire for the switching TFT 3802; 3803 indicates the gate wire for the switching TFT 3802; 3804 indicates a current-control TFT; 3805 indicates a capacitor; 3806 and 3808 indicate current supply lines; and 3807 indicates an EL device.

Figure 17A:
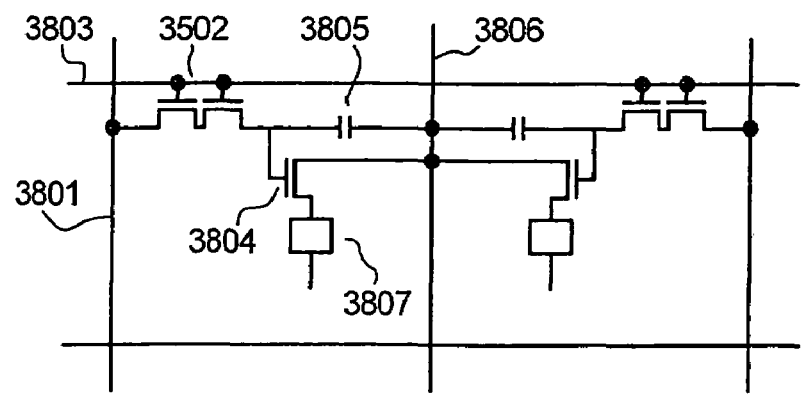
FIG. 17A is an example of a circuit drawing of the pixel area of FIG. 15A.

In the example of FIG. 17A, the current supply line 3806 is common to the two pixels. Specifically, this example is characterized in that two pixels are lineal-symmetrically formed with the current supply line 3806 being the center between them. Since the number of current supply lines can be reduced therein, this example is advantageous in that the pixel pattern can be much finer and thinner.

Figure 17B:
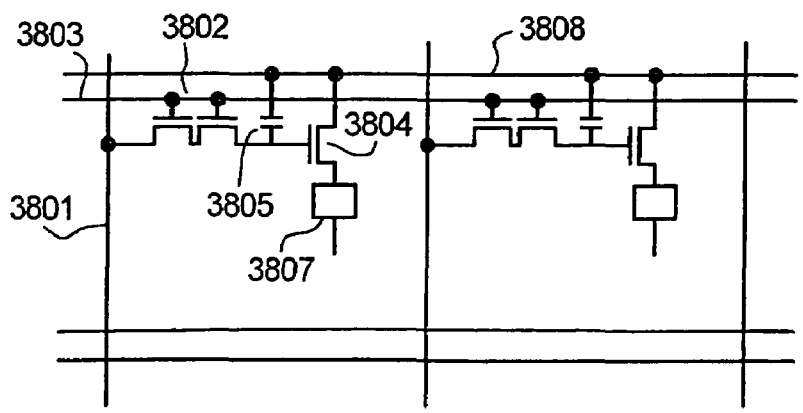
FIG. 17B is an example of a circuit drawing of the pixel area of FIG. 15A.

In the example of FIG. 17B, the current supply line 3808 is formed in parallel to the gate wire 3803. Specifically, in this, the current supply line 3808 is so constructed that it does not overlap with the gate wire 3803, but is not limitative. Being different from the illustrated case, the two may overlap with each other via an insulating film therebetween so far as they are of different layers. Since the current supply line 3808 and the gate wire 3803 may enjoy the common exclusive area therein, this example is advantageous in that the pixel pattern can be much finer and thinner.

Figure 17C:
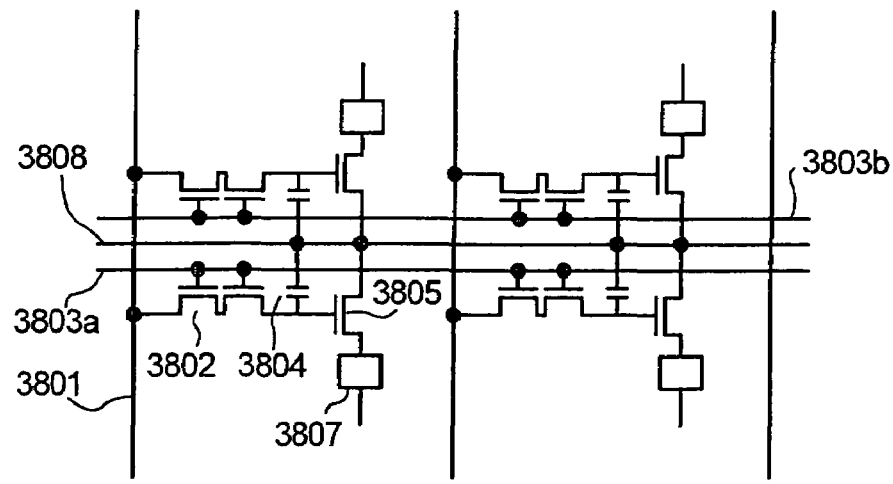
FIG. 17C is an example of a circuit drawing of the pixel area of FIG. 15A.

The structure of the example of FIG. 17C is characterized in that the current supply line 3808 is formed in parallel to the gate wires 3803r like in FIG. 38B, and that two pixels are lineal-symmetrically formed with the current supply line 3808 being the center between them. In this, it is also effective to provide the current supply line 3808 in such a manner that it overlaps with any one of the gate wires 3803. Since the number of current supply lines can be reduced therein, this example is advantageous in that the pixel pattern can be much finer and thinner.

The constitution of this Example can be combined with any constitution of Example 1 through 6 in any desired manner. Incorporating the EL display panel having the pixel structure of this Example into the electronic appliance of Example 3 as its display part is advantageous.

Example 10

The figure of Example 7, that are illustrated in FIG. 15A and FIG. 15B is provided with the capacitor 3504 which acts to retain the voltage applied to the gate in the current-control TFT 3503. In the example, however, the capacitor 3504 may be omitted.

In the Example 7, the current-control TFT 3503 is NTFT of the invention, as shown in Examples 1 and 2. Therefore, in the example, the LDD region is so formed that it overlaps the gate electrode with the gate-insulating film interposed therebetween. In the overlapped region, a parasitic capacitance is formed, as generally referred to as a gate capacitance. The present example is characterized in that the parasitic capacitance is positively utilized in place of the capacitor 3504.

The parasitic capacitance in question varies, depending on the area in which the gate electrode overlaps with the LDD region, and is therefore determined according to the length of the LDD region in the overlapped area.

Also as illustrated in FIG. 17A, FIG. 17B and FIG. 17C of Example 9, the capacitor 3805 can be omitted.

The constitution of this Example can be combined with any constitution of Examples 1 through 6 in any desired manner. Incorporating the EL display panel having the pixel structure of the present example into the electronic appliance of Example 19 as its display part is advantageous.

According to the present invention, a photoresist pattern determining the length of a low-concentration impurity region can be formed in a self-alignment manner by exposing a substrate to the light applied to the back of the substrate, and hence the length of the low-concentration impurity region can be controlled with higher accuracy in the present invention than in the conventional embodiment shown in FIG. 9. Also, since the present invention does not need an anodic oxidation process, it can facilitate the integration of a circuit and does not limit the material of a gate wiring to aluminum.

What is claimed is:

1. A display device comprising:
    a substrate;
    a first pixel comprising:
        a first switching thin film transistor;
        a first current control thin film transistor;
        a first pixel electrode;
    a second pixel comprising:
        a second switching thin film transistor;
        a second current control thin film transistor;
        a second pixel electrode;
    a gate wiring extending along a first direction, and electrically connected to a first gate electrode of the first switching thin film transistor and to a second gate electrode of the second switching thin film transistor
    a first source wiring extending across the gate wiring, and electrically connected to a third gate electrode of the first current control thin film transistor via a first semiconductor island of the first switching thin film transistor;
    a second source wiring extending across the gate wiring, and electrically connected to a fourth gate electrode of the second current control thin film transistor via a second semiconductor island of the second switching thin film transistor; and
    a power line electrically connected to the first pixel electrode via a third semiconductor island of the first current control thin film transistor, and to the second pixel electrode via a fourth semiconductor island of the second current control thin film transistor,
    wherein the power line is located adjacent to both of the first pixel and the second pixel, and
    wherein the first pixel, the second pixel, the gate wiring, the first source wiring, the second source wiring and the power line are formed over the substrate.

2. The display device according to claim 1,
    wherein the power line extends in parallel with the first source wiring and the second source wiring.

3. The display device according to claim 1,
    wherein the first pixel further comprising:
        a first organic electroluminescence layer over the first pixel electrode, and
        a first opposing electrode over the first organic electroluminescence layer, and
    wherein the second pixel further comprising:
        a second organic electroluminescence layer over the second pixel electrode, and
        a second opposing electrode over the second organic electroluminescence layer.

4. The display device according to claim 1,
    wherein at least a part of the power line is formed from the same conductive layer with the gate wiring.

5. A display device comprising:
    a substrate;
    a first pixel comprising:
        a first switching thin film transistor;
        a first current control thin film transistor;
        a first pixel electrode;
    a second pixel comprising:
        a second switching thin film transistor;
        a second current control thin film transistor;
        a second pixel electrode;
    a gate wiring extending along a first direction, and electrically connected to a first gate electrode of the first switching thin film transistor and to a second gate electrode of the second switching thin film transistor
    a first source wiring extending across the gate wiring, and electrically connected to a third gate electrode of the first current control thin film transistor via a first semiconductor island of the first switching thin film transistor;
    a second source wiring extending across the gate wiring, and electrically connected to a fourth gate electrode of the second current control thin film transistor via a second semiconductor island of the second switching thin film transistor; and
    a power line electrically connected to the first pixel electrode via a third semiconductor island of the first current control thin film transistor, and to the second pixel electrode via a fourth semiconductor island of the second current control thin film transistor,
    wherein the power line is located adjacent to both of the first pixel and the second pixel, and
    wherein the first pixel, the second pixel, the gate wiring, the first source wiring, the second source wiring and the power line are formed over the substrate, and
    wherein both of the first current control thin film transistor and the second current control thin film transistor are the N-channel type thin film transistors.

6. The display device according to claim 5,
    wherein the power line extends in parallel with the first source wiring and the second source wiring.

7. The display device according to claim 5,
wherein the first pixel further comprising:
  a first organic electroluminescence layer over the first pixel electrode, and
  a first opposing electrode over the first organic electroluminescence layer, and
wherein the second pixel further comprising:
  a second organic electroluminescence layer over the second pixel electrode, and
  a second opposing electrode over the second organic electroluminescence layer.

8. The display device according to claim 5,
wherein at least a part of the power line is formed from the same conductive layer with the gate wiring.

9. A display device comprising:
a substrate;
a first pixel comprising:
  a first switching thin film transistor;
  a first current control thin film transistor;
  a first pixel electrode;
a second pixel comprising:
  a second switching thin film transistor;
  a second current control thin film transistor;
  a second pixel electrode;
a gate wiring extending along a first direction, and electrically connected to a first gate electrode of the first switching thin film transistor and to a second gate electrode of the second switching thin film transistor
a first source wiring extending across the gate wiring, and electrically connected to a third gate electrode of the first current control thin film transistor via a first semiconductor island of the first switching thin film transistor;
a second source wiring extending across the gate wiring, and electrically connected to a fourth gate electrode of the second current control thin film transistor via a second semiconductor island of the second switching thin film transistor; and
a power line electrically connected to the first pixel electrode via a third semiconductor island of the first current control thin film transistor, and to the second pixel electrode via a fourth semiconductor island of the second current control thin film transistor,
wherein the power line is located adjacent to both of the first pixel and the second pixel, and
wherein the first pixel, the second pixel, the gate wiring, the first source wiring, the second source wiring and the power line are formed over the substrate, and
wherein both of the third semiconductor island and the fourth semiconductor island are polycrystalline silicon films.

10. The display device according to claim 9,
wherein the power line extends in parallel with the first source wiring and the second source wiring.

11. The display device according to claim 9,
wherein the first pixel further comprising:
  a first organic electroluminescence layer over the first pixel electrode, and
  a first opposing electrode over the first organic electroluminescence layer, and
wherein the second pixel further comprising:
  a second organic electroluminescence layer over the second pixel electrode, and
  a second opposing electrode over the second organic electroluminescence layer.

12. The display device according to claim 9,
wherein at least a part of the power line is formed from the same conductive layer with the gate wiring.

13. A display device comprising:
a substrate;
a first pixel comprising:
  a first switching thin film transistor;
  a first current control thin film transistor;
  a first pixel electrode;
a second pixel comprising:
  a second switching thin film transistor;
  a second current control thin film transistor;
  a second pixel electrode;
a gate wiring extending along a first direction, and electrically connected to a first gate electrode of the first switching thin film transistor and to a second gate electrode of the second switching thin film transistor
a first source wiring extending across the gate wiring, and electrically connected to a third gate electrode of the first current control thin film transistor via a first semiconductor island of the first switching thin film transistor;
a second source wiring extending across the gate wiring, and electrically connected to a fourth gate electrode of the second current control thin film transistor via a second semiconductor island of the second switching thin film transistor; and
a power line electrically connected to the first pixel electrode via a third semiconductor island of the first current control thin film transistor, and to the second pixel electrode via a fourth semiconductor island of the second current control thin film transistor,
wherein the power line is located adjacent to both of the first pixel and the second pixel, and
wherein the first pixel, the second pixel, the gate wiring, the first source wiring, the second source wiring and the power line are formed over the substrate,
wherein both of the third semiconductor island and the fourth semiconductor island are polycrystalline silicon films,
wherein the third semiconductor island has a first channel region, a first source region, a first drain region and a first lightly doped region between the first channel region and any one of the first source region and the first drain region,
wherein the fourth semiconductor island has a second channel region, a second source region, a second drain region and a second lightly doped region between the second channel region and any one of the second source region and the second drain region.

14. The display device according to claim 13,
wherein the power line extends in parallel with the first source wiring and the second source wiring.

15. The display device according to claim 13,
wherein the first pixel further comprising:
  a first organic electroluminescence layer over the first pixel electrode, and
  a first opposing electrode over the first organic electroluminescence layer, and
wherein the second pixel further comprising:
  a second organic electroluminescence layer over the second pixel electrode, and
  a second opposing electrode over the second organic electroluminescence layer.

16. The display device according to claim 13,
wherein at least a part of the power line is formed from the same conductive layer with the gate wiring.

17. A display device comprising:
a substrate;
a first pixel comprising:
- a first switching thin film transistor;
- a first current control thin film transistor;
- a first pixel electrode;

a second pixel comprising:
- a second switching thin film transistor;
- a second current control thin film transistor;
- a second pixel electrode;

a gate wiring extending along a first direction, and electrically connected to a first gate electrode of the first switching thin film transistor and to a second gate electrode of the second switching thin film transistor a first source wiring extending across the gate wiring, and electrically connected to a third gate electrode of the first current control thin film transistor via a first semiconductor island of the first switching thin film transistor;

a second source wiring extending across the gate wiring, and electrically connected to a fourth gate electrode of the second current control thin film transistor via a second semiconductor island of the second switching thin film transistor; and a power line electrically connected to the first pixel electrode via a third semiconductor island of the first current control thin film transistor, and to the second pixel electrode via a fourth semiconductor island of the second current control thin film transistor, wherein the power line is located adjacent to both of the first pixel and the second pixel, and wherein the first pixel, the second pixel, the gate wiring, the first source wiring, the second source wiring and the power line are formed over the substrate, wherein both of the first current control thin film transistor and the second current control thin film transistor are the N-channel type thin film transistors, wherein both of the third semiconductor island and the fourth semiconductor island are polycrystalline silicon films, and wherein the each of the first switching thin film transistor and the second switching thin film transistor has a double-gate structure.

18. The display device according to claim 17,
wherein the power line extends in parallel with the first source wiring and the second source wiring.

19. The display device according to claim 17,
wherein the first pixel further comprising:
- a first organic electroluminescence layer over the first pixel electrode, and
- a first opposing electrode over the first organic electroluminescence layer, and wherein the second pixel further comprising:
- a second organic electroluminescence layer over the second pixel electrode, and
- a second opposing electrode over the second organic electroluminescence layer.

20. The display device according to claim 17,
wherein at least a part of the power line is formed from the same conductive layer with the gate wiring.

* * * * *